United States Patent
Kawabata et al.

[11] Patent Number: 6,147,919
[45] Date of Patent: Nov. 14, 2000

[54] SEMICONDUCTOR MEMORY EMPLOYING DIRECT-TYPE SENSE AMPLIFIERS CAPABLE OF REALIZING HIGH-SPEED ACCESS

[75] Inventors: Kuninori Kawabata; Masato Matsumiya; Satoshi Eto; Masato Takita; Toshikazu Nakamura; Masatomo Hasegawa; Hideki Kanou; Ayako Kitamoto; Toru Koga; Yuki Ishii; Akira Kikutake; Yuichi Uzawa, all of Kawasaki, Japan

[73] Assignee: Fujitsu Limited, Kanagawa, Japan

[21] Appl. No.: 09/274,245

[22] Filed: Mar. 23, 1999

[30] Foreign Application Priority Data

Jun. 29, 1998 [JP] Japan .................................. 10-182175
Jul. 16, 1998 [JP] Japan .................................. 10-201851

[51] Int. Cl.$^7$ ........................................................ G11C 7/02
[52] U.S. Cl. ...................... 365/208; 365/205; 365/230.06
[58] Field of Search .................................... 365/205, 207, 365/208, 230.08, 230.06, 63

[56] References Cited

U.S. PATENT DOCUMENTS 5,933,380 8/1999 Tsuchida et al. ...................... 365/207
5,953,261 9/1999 Furutani et al. .................... 365/189.05

*Primary Examiner*—Son Mai
*Attorney, Agent, or Firm*—Arent Fox Kintner Plotkin & Kahn PLLC

[57] ABSTRACT

A semiconductor memory has memory cells arranged in arrays, direct-type sense amplifiers arranged in each column of the memory cells, for writing and reading data to and from a memory cell to be accessed, column selection lines for selecting sense amplifiers that are in a column that involves the memory cell to be accessed, write-only column selection lines for selecting sense amplifiers that are in a row that involves the memory cell to be accessed if the memory cell is accessed to write data thereto, and local drivers. The sense amplifiers are grouped, in each row, into sense amplifier blocks. The write-only column selection lines consist of first selection lines for selecting sense amplifier blocks that are in the row that involves the memory cell to be accessed for data write and second selection lines for selecting sense amplifiers that are contained in the selected sense amplifier blocks. The local drivers apply a selection signal to the second selection lines according to a selection signal from the first selection lines. The write-only column selection lines are controlled by signals that are used to control the sense amplifiers.

19 Claims, 23 Drawing Sheets

41

42

SEMICONDUCTOR MEMORY EMPLOYING DIRECT-TYPE SENSE AMPLIFIERS CAPABLE OF REALIZING HIGH-SPEED ACCESS

BACKGROUND OF THE INVENTION

1. Field of the Invention

The present invention relates to a semiconductor memory and, more particularly, to a semiconductor memory employing direct-type sense amplifiers capable of realizing high-speed access.

2. Description of the Related Art

Recent semiconductor technology has allowed development of high-speed, high-integrated semiconductor memories such as dynamic random access memories (DRAMs). Of these memories, synchronous DRAMs (SDRAMs) operate in synchronization with an external clock signal to improve the operation speed thereof and to realize pipeline operations therein.

Some semiconductor memories (SDRAMs) employ direct-type sense amplifiers and select them for data write with the use of column selection lines running in parallel with bit lines and write-only column selection lines running orthogonally to the column selection lines. Note that the direct-type sense amplifier can be constituted to separate bit lines (BL, /BL) from an input/output side, and therefore, is appropriate for achieving pipeline processes in the memory. Further, the semiconductor memories usually employ a multiple-bit data width instead of a conventional single bit data width.

By the way, a memory controller handles data between the memory and a CPU (Central Processing Unit) byte by byte. Namely, the minimum unit of data handled between the memory and the CPU is a byte. Nevertheless, to transfer data at high speed, the memory and CPU must be connected to each other through a wide data bus of, for example, 16 bits (two bytes) or 32 bits (four bytes).

In this way, broadening a data width to larger than a minimum data unit (one byte) handled by the memory controller is advantageous in handling data of large width. This, however, is disadvantageous when handling data of narrow width, less than eight bits (one byte), because each piece of data must have bits equal to the unit data width. To avoid a useless operation, some semiconductor memories have a masking function. This function works on each minimum data unit (one byte) handled by the memory controller. Note that, in the prior art semiconductor memories, the masking function causes a delay in a column selection operation, and such delay is an obstacle to improve the operation speed of the memory, and therefore, must be minimized.

Further, there is a requirement for the semiconductor memory (SDRAM) to provide a technique and layout for efficiently controlling the write-only column selection lines.

Prior art and the problems thereof will be explained later with reference to accompanying drawings.

SUMMARY OF THE INVENTION

An object of the present invention is to provide a semiconductor memory capable of minimizing a delay in a write-only column selection signal and achieving high speed operation. Another object of the present invention is to provide a semiconductor memory capable of easily controlling write-only column selection lines.

According to the present invention, there is provided a semiconductor memory comprising a plurality of memory cells arranged in arrays; a plurality of direct-type sense amplifiers arranged in each column of the memory cells, for writing and reading data to and from a memory cell to be accessed; a plurality of column selection lines for selecting sense amplifiers that are in a column that involves the memory cell to be accessed; a plurality of write-only column selection lines for selecting sense amplifiers that are in a row that involves the memory cell to be accessed if the memory cell is accessed to write data thereto; and local drivers, wherein the sense amplifiers are grouped, in each row, into sense amplifier blocks; the write-only column selection lines include first selection lines for selecting sense amplifier blocks that are in the row that involves the memory cell to be accessed for data write, and second selection lines for selecting sense amplifiers that are contained in the selected sense amplifier blocks; and the local drivers apply a selection signal to the second selection lines according to a selection signal from the first selection lines.

A data write access may be carried out to a memory cell that is related to an intersection of a specified one of the column selection lines and a specified one of the second selection lines. The semiconductor memory may further comprise an input terminal for receiving mask data to mask some bits among data to be written into the semiconductor memory so that the masked bits are not written into the semiconductor memory; and first drivers for driving the first selection lines, the first drivers prohibiting, according to the mask data, at least part of the sense amplifier blocks that are in the row that involves the memory cell to be accessed, from being selected.

The semiconductor memory may further comprise an input terminal for receiving mask data to mask some bits among data to be written into the semiconductor memory so that the masked bits are not written into the semiconductor memory, wherein the local drivers may prohibit, according to the mask data, at least part of the sense amplifiers contained in the selected sense amplifier blocks from being selected without regard to the selection signal from the first selection lines. The semiconductor memory may employ a block selection signal for selecting a sense amplifier block that contains a sense amplifier that is in a column involving the memory cell to be accessed, wherein the local drivers may apply a selection signal to the second selection lines according to the block selection signal as well as the selection signal from the first selection lines.

According to the present invention, there is also provided a semiconductor memory comprising a plurality of memory cells arranged in arrays; a plurality of direct-type sense amplifiers arranged in each column of the memory cells, for writing and reading data to and from a memory cell to be accessed; a plurality of column selection lines for selecting sense amplifiers that are in a column that involves the memory cell to be accessed; a plurality of write-only column selection lines for selecting sense amplifiers that are in a row that involves the memory cell to be accessed if the memory cell is accessed to write data thereto; an input terminal for receiving mask data to mask some bits among data to be written into the semiconductor memory so that the masked bits are not written into the semiconductor memory; and a plurality of drivers for driving the write-only column selection lines, the drivers prohibiting, according to the mask data, at least part of the sense amplifier blocks that are in the row that involves the memory cell to be accessed, from being selected.

The sense amplifiers may be grouped, in each row, into sense amplifier blocks; and the write-only column selection lines may include first selection lines for selecting sense amplifier blocks that are in the row that involves the memory cell to be accessed for data write, and second selection lines for selecting sense amplifiers that are contained in the selected sense amplifier blocks. A data write access may be carried out to a memory cell that is related to an intersection of a specified one of the column selection lines and a specified one of the second selection lines.

Further, according to the present invention, there is provided a semiconductor memory comprising a plurality of memory cells arranged in arrays; a plurality of direct-type sense amplifiers arranged in each column of the memory cells, for writing and reading data to and from a memory cell to be accessed; a plurality of column selection lines for selecting sense amplifiers that are in a column that involves the memory cell to be accessed; and a plurality of write-only column selection lines for selecting sense amplifiers that are in a row that involves the memory cell to be accessed if the memory cell is accessed to write data thereto, wherein the write-only column selection lines are controlled by a signal that controls the sense amplifiers.

The write-only column selection lines may be controlled by a signal used to select the sense amplifiers. The sense amplifiers may be shared sense amplifiers, and the write-only column selection lines may be controlled by a bit line isolation gate control signal used to control the shared sense amplifiers. The write-only column selection lines may be controlled by a bit line precharge activation control signal for the sense amplifiers. The write-only column selection lines may be controlled by a latch enable signal for the sense amplifiers.

The write-only column selection lines may be orthogonal to the column selection lines. The write-only column selection lines may be controlled by drivers that include main drivers and secondary drivers; the main drivers may select groups from among the sense amplifiers; and the secondary drivers may drive sense amplifiers contained in the selected groups. The main drivers may be arranged at intersections of a column of main word decoders and rows of the sense amplifiers, and the secondary drivers may be arranged at intersections of columns of secondary word decoders and rows of the sense amplifiers. The secondary drivers may be arranged at intersections of every "N"th row of secondary word decoders and rows of the sense amplifiers, where "N" is a natural number.

The secondary drivers may be controlled by a block selection signal. Lines for passing the block selection signal may be arranged in columns of the secondary word decoders in parallel with the column selection lines. The column selection lines and the write-only column selection lines may be formed in different metal wiring layers.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems in the prior art will be explained.

Recent semiconductor technology has allowed development of high-speed, highly-integrated semiconductor memories.

The semiconductor memories will further be integrated to have larger capacity due to a fine processing technology. Highly-integrated, large-capacity memories usually employ a multiple-bit data width instead of a conventional single bit data width.

To improve the operation speed of the memories, a synchronous technique is used. This technique employs an external clock signal to synchronize the data input/output operations and internal operations of the memories, thereby improving the operation speed thereof and realizing pipeline operations therein.

Figure 1:
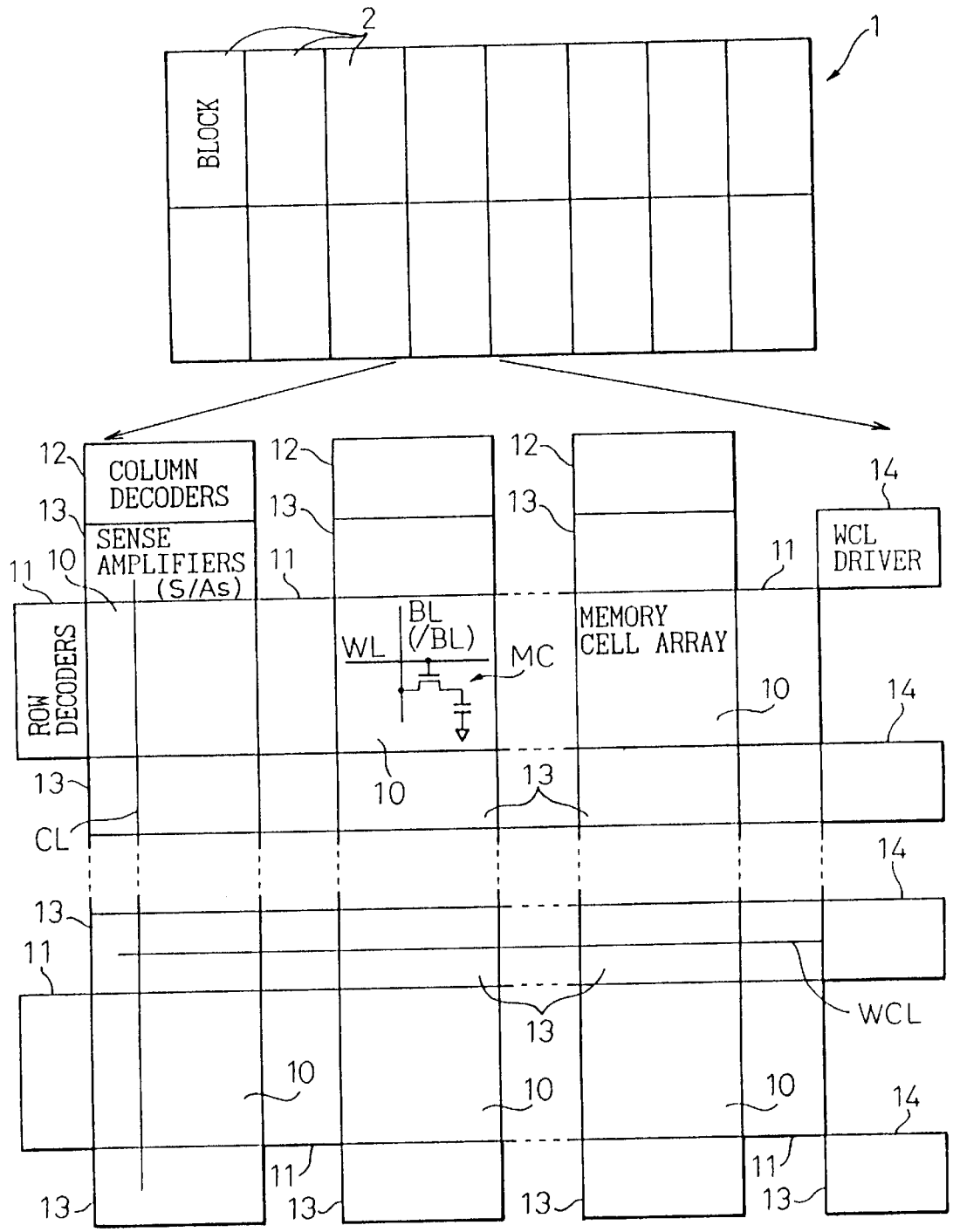
FIG. 1 shows blocks and arrays of memory cells in a semiconductor memory according to a prior art.

FIG. 1 shows blocks and arrays of memory cells in a semiconductor memory according to a prior art. This memory is an SDRAM.

The memory has a large capacity of, for example, 64 or 256 megabits. Memory cells of the memory are divided into blocks 2. Each of the blocks 2 is divided into memory cell arrays 10 that are arranged in a matrix of rows and columns. In each of the memory cell arrays 10, the memory cells are arranged in a matrix of rows and columns.

A row decoder 11 is arranged along each vertical side of the memory cell array 10, and a group of sense amplifiers 13 is arranged along each horizontal side of the memory cell array 10. A column decoder 12 is provided for each column of the memory cell arrays 10.

To access a target memory cell, the row decoder 11 activates a word line WL to which the target memory cell belongs, and the column decoder 12 activates a sense amplifier 13 connected to bit lines BL and /BL to which the target memory cell is connected. The output of the column decoder 12 is supplied to the sense amplifier 13 through a column selection line CL. If the target memory cell is accessed to write data thereto, a write-only column selection driver (hereinafter referred to as WCL driver) 14 drives a write-only column selection line (hereinafter referred to as WCL line) to activate the sense amplifier connected to the target memory cell.

Figure 2:
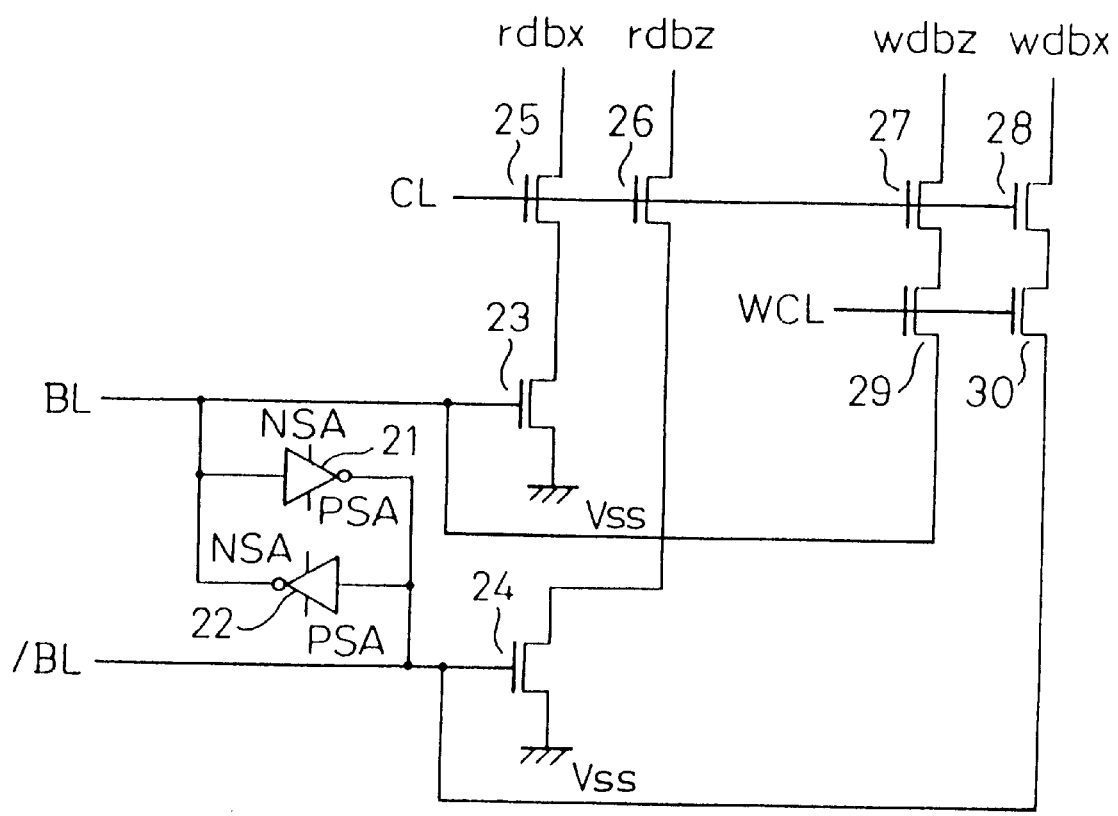
FIG. 2 shows a direct-type sense amplifier of the memory of FIG. 1.

FIG. 2 shows the details of the direct-type sense amplifier 13 of the SDRAM of FIG. 1.

The sense amplifier 13 has two inverters 21 and 22 that form a flip-flop. The flip-flop is connected to complementary bit lines BL and /BL. The bit lines are directly connected to the gates of transistors 23 and 24 that transfer information from the bit lines to a data bus.

When reading data out of a target memory cell, the flip-flop is activated when a decoded row signal is supplied to a word line WL. Data in the target memory cell produces a potential difference between the bit lines BL and /BL, and the flip-flop amplifies the potential difference. One of the transistors 23 and 24 is turned on, and a selection signal is supplied to the column selection line CL to turn on transistors 25 and 26, which provide signals rdbx and rdbz representing the data from the target memory cell.

When writing data into a target memory cell, a selection signal is supplied to the column selection line CL to turn on transistors 27 and 28. A selection signal is supplied to the WCL line to turn on transistors 29 and 30. As a result, write data wdbz and wdbx change the potential levels of the bit lines BL and /BL, and the flip-flop amplifies the potential levels of the bit lines. A word line WL is activated to connect the target memory cell to one of the bit lines BL and /BL, to change the state of the target memory cell accordingly.

The direct-type sense amplifier of FIG. 2 separates the bit lines BL and /BL from the input/output side, and therefore, is appropriate for achieving pipeline processes in the memory. The direct-type sense amplifier must simultaneously supply selection signals to the column selection line CL and the WCL line.

In FIG. 1, any group of the sense amplifiers 13 is connectable to one of the two adjacent memory cell arrays 10.

Figure 3:
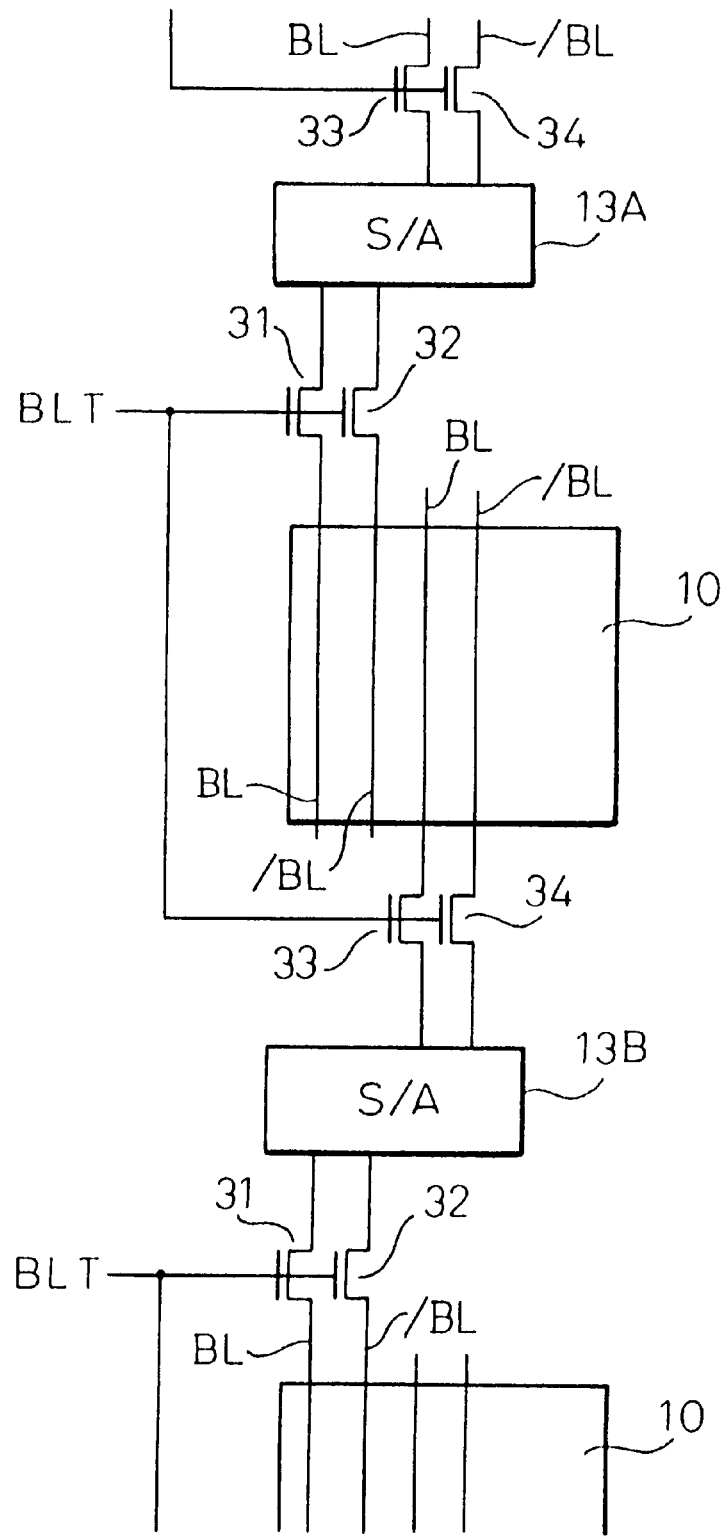
FIG. 3 shows a sense amplifier switching mechanism of the memory of FIG. 1.

FIG. 3 shows a switching mechanism for switching a shared sense amplifier group between the two adjacent memory cell arrays 10 in the memory of FIG. 1.

Each sense amplifier 13 is connected to upper and lower bit line pairs. For example, a sense amplifier 13A is connected to upper bit lines BL and BL/ through transistors 33 and 34 and to lower bit lines BL and /BL thorough transistors 31 and 32. These transistors serve as switches. The bit lines extending from the sense amplifier 13A and those from a sense amplifier 131B are in parallel with one another and are connected to memory cells, which are connected to word lines. When a given word line in the memory cell array 10 between the sense amplifiers 13A and 13B is accessed, a bit line isolation gate control signal BLT is supplied to the transistors 31 and 32 of the sense amplifier 13A and to the transistors 33 and 34 of the sense amplifier 13B, so that the sense amplifiers 13A and 13B are connected to the memory cell array 10 between them. If a word line in the memory cell array 10 below the sense amplifier 13B is accessed, the signal BLT is supplied to the transistors 31 and 32 of the sense amplifier 13B to connect the sense amplifier 13B to the memory cell array 10 in question through the lower bit lines BL and /BL.

In the semiconductor memory, the column selection lines CL are formed in a top metal wiring layer having a low resistance. It is difficult to form the WCL lines in parallel with the column selection lines CL. Accordingly, the WCL lines are formed in parallel with the word lines WL that are orthogonal to the column selection lines CL. The WCL lines are formed in a metal wiring layer that contains sense amplifier activation signal lines and that has higher resistance than the top metal wiring layer that contains the column selection lines CL.

Figure 4:
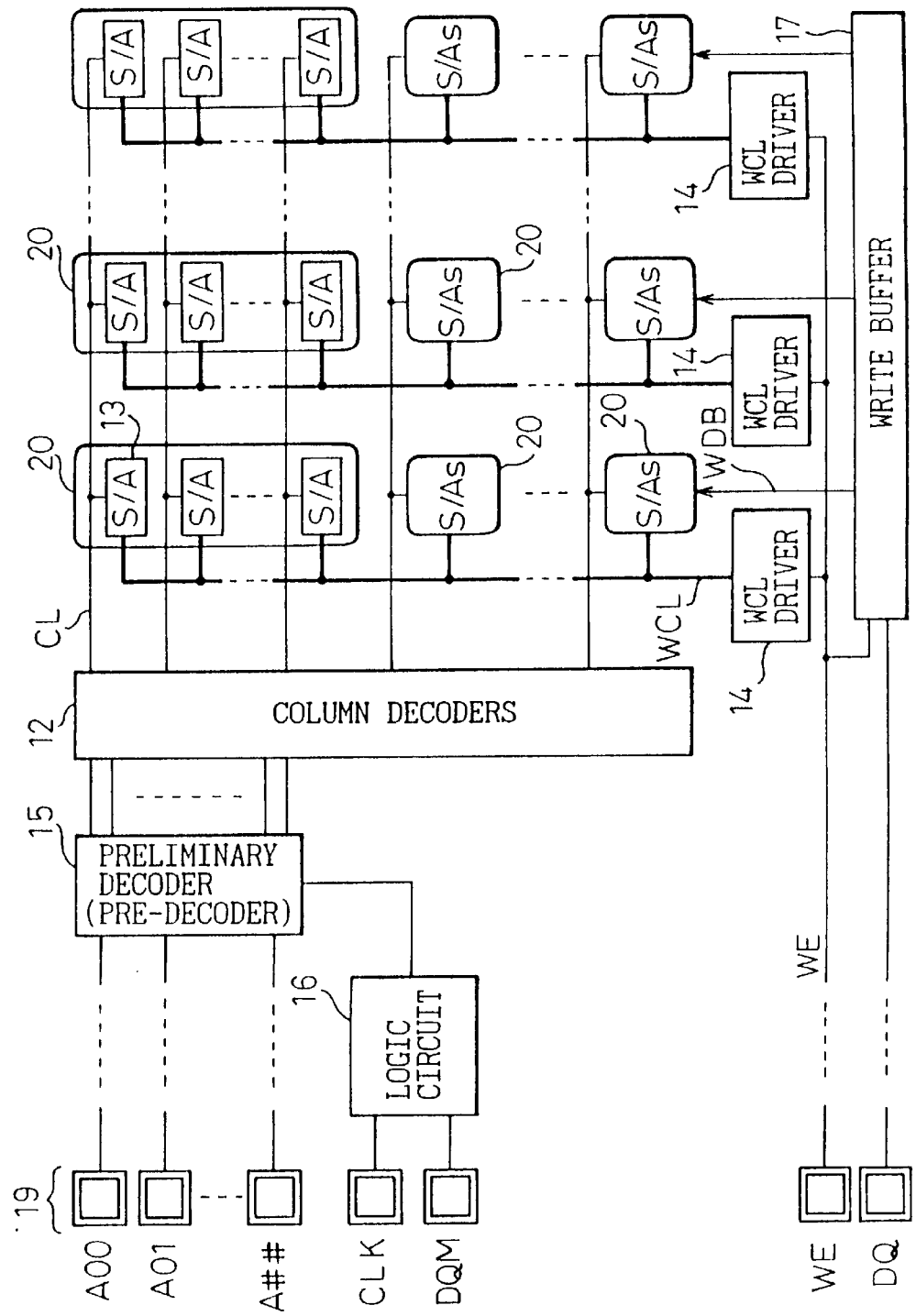
FIG. 4 shows a sense amplifier driving system of the memory of FIG. 1.

FIG. 4 shows a sense amplifier driving system of the memory of FIG. 1.

The sense amplifiers 13 are arranged in every column of every block of the memory. The number of the sense amplifiers 13 in each column is equal to the number of the memory cell arrays 10 counted along the length of the column plus one, because the sense amplifier 13 is arranged on each side of the memory cell array 10 in every column. The sense amplifiers 13 in the same row are grouped into blocks 20.

A column address signal is received by an input terminal 19 and is preliminarily decoded by a preliminary decoder (pre-decoder) 15. The column decoder 12 generates a column selection signal from the preliminarily decoded signal and supplies the generated signal to the column selection lines CL. When writing data into a memory cell, a write enable signal WE is supplied to the input terminal 19, which transfers the signal to the WCL drivers 14. According to the signal WE and a decoded row signal, the WCL drivers 14 generate a write-only column selection signal (hereinafter referred to as WCL signal), which is supplied to a selected WCL line. The sense amplifier 13 connected to an activated column selection line CL and the selected WCL line is connected to a write data bus. At the same time, data DQ to the input terminal 19 is supplied to a write buffer 17 and is transferred to a block of the sense amplifiers 13, to write the data into an accessed memory cell.

Figure 5:
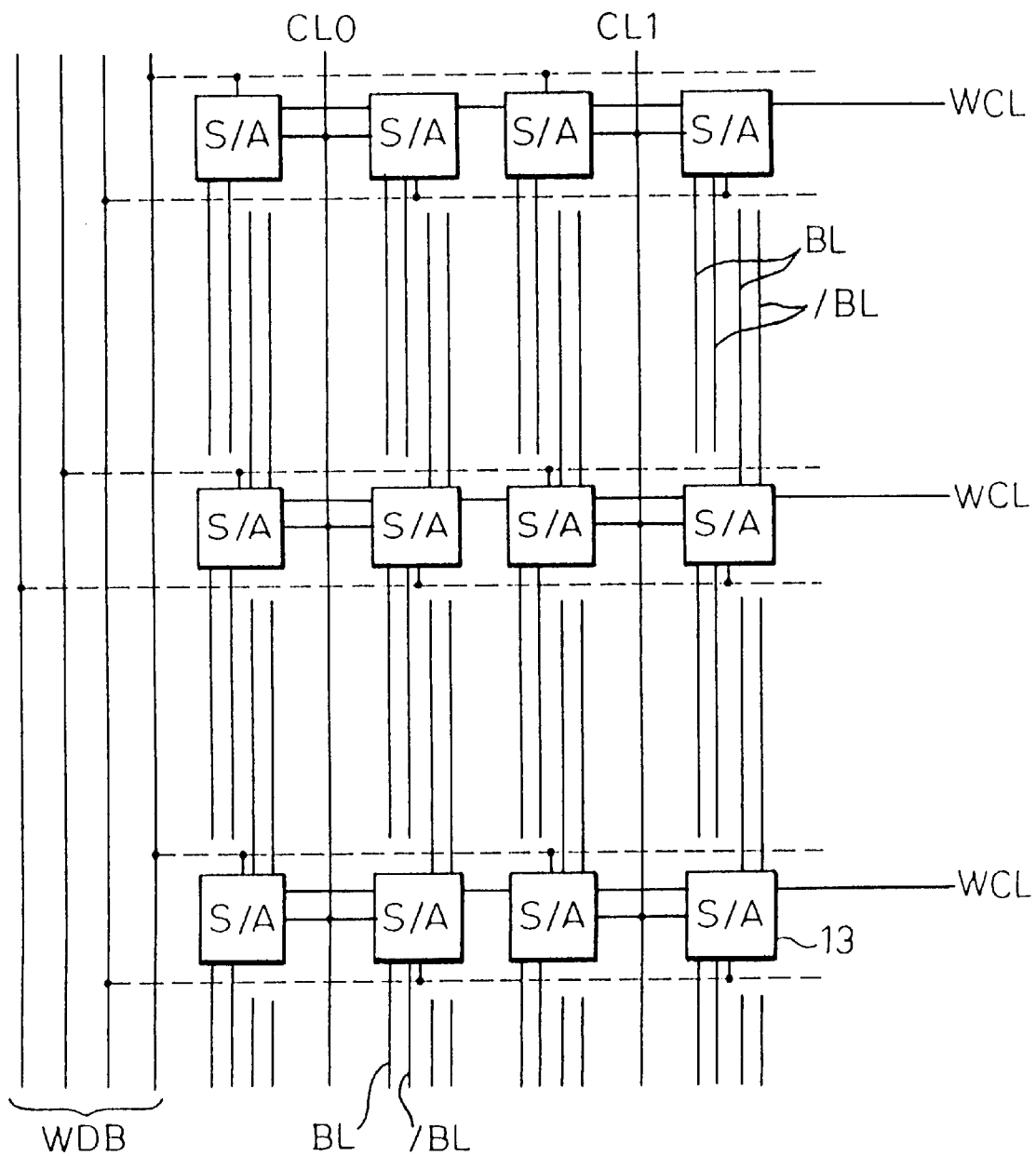
FIG. 5 shows column selection lines and sense amplifiers in the sense-amplifier driving system of FIG. 4.

FIG. 5 shows column selection lines and sense amplifiers in the system of FIG. 4.

Although FIG. 4 shows that a column selection line CL and a WCL line access a single sense amplifier 13, it is practical to connect two sense amplifiers of the same group to a column selection line CL as shown in FIG. 5 to cope with a multiple-bit data width and enlarge the pitches of the column selection lines CL. As explained in FIG. 3, each memory cell array 10 has two groups of sense amplifiers 13 along each horizontal side thereof. The two groups of sense amplifiers 13 extend bit line pairs toward the memory cell array 10 and are simultaneously operated.

For a given memory cell array 10, two sense amplifiers of one group connected to a column selection line CL are connected to first and second lines of a write data bus WDB, and two sense amplifiers of the other group connected to the column selection line CL are connected to third and fourth lines of the write data bus WDB. When an address is accessed, a column selection line CL is selected and a word line WL is selected, to select four sense amplifiers.

In a write operation, two WCL lines for selecting sense amplifiers on opposite sides of an accessed word line are selected, to select four sense amplifiers to write data. In this way, four bits of data are simultaneously read and written. In addition, several of the blocks 2 of FIG. 1 are simultaneously accessed to cope with a multiple-bit data width.

The above is a basic structure of the semiconductor memory that employs direct-type sense amplifiers and operates in synchronization with an external clock signal.

The memory mentioned above handles multiple-bit data. A memory controller handles data between the memory and a CPU byte by byte. Namely, a minimum unit of data handled between the memory and the CPU is a byte. To transfer data of a large width at high speed, the memory and CPU must be connected to each other through a wide data bus of, for example, 16 bits (two bytes) or 32 bits (four bytes). To read or write data of 64 bits, the 16-bit data bus needs four operations, and the 32-bit data bus only two operations.

In this way, broadening a data width to larger than a minimum data unit (one byte) handled by the memory controller is advantageous in handling data of large width. This, however, is disadvantageous in handling data of small width less than eight bits (one byte) because each piece of data must have bits equal to the unit data width. Namely, when the small width data is handled, useless bits should be generated (provided), and a complicated operation may be necessary, or a delay time may be increased. The narrow width data frequently occurs when reading and writing moving parts of an image that is mostly still. To avoid a useless operation, some semiconductor memories have a masking function. This function works on each minimum data unit (one byte) handled by the memory controller. If a valid part of given data is smaller than a bus width, the function removes useless part from the data byte by byte according to a signal supplied through an external terminal DQM (FIG. 4). When reading and writing, for example, data of one bit through a 16-bit bus, the function saves eight bits (one byte) including the valid bit and discards the remaining eight bits according to a mask signal from the terminal DQM, thereby suppressing the number of useless bits to seven. In FIG. 4, the mask signal from the terminal DQM is supplied to a logic circuit 16, which provides the signal to the pre-decoder 15, etc.

Returning to FIG. 1, the semiconductor memory (SDRAM) has a capacity of, for example, 256 megabits. The memory cells are divided into 16 blocks each containing 16 megabits. The memory cells in each block are arranged in a matrix of 2K bits by 8K bits, i.e., 2K bits in a horizontal direction and 8K bits in a vertical direction (1K bits=1024 bits). These memory cells in each block are grouped into memory cell arrays 10, of which 8 are in the horizontal direction and 16 in the vertical direction. Each column of memory cells extending in the vertical direction includes "16+1" rows of sense amplifiers because sense amplifiers are used as shown in FIG. 3. This means that each column selection line CL extending from the column decoder 12 is connected to 17 rows of sense amplifiers. Namely, a single column selection line CL selects 17 rows of sense amplifiers 13.

Each row of memory cell arrays 10 involves 2000 bit line pairs, and therefore, 2K sense amplifiers, which are arranged in two rows along the opposite sides of the row of memory cell arrays 10. Each row of 1K sense amplifiers is connected to a WCL line, and therefore, a WCL signal from the WCL driver 14 must drive 1K sense amplifiers.

In this way, every WCL line is connected to many sense amplifiers whose number is several hundreds of times greater than the number of sense amplifiers connected to a column selection line CL. As shown in FIG. 2, the column selection line CL and WCL line are connected to transistor gates, and therefore, gate capacitance applied to the WCL line is several hundreds of times larger than that applied to the column selection line CL. An increase in the gate capacitance of a line increases delay in a signal transmitted through the line. The WCL lines are formed in the metal wiring layer whose resistance is greater than that of the metal wiring layer where the column selection lines CL are formed, as mentioned above. This increases the delay in the WCL lines.

Figure 6:
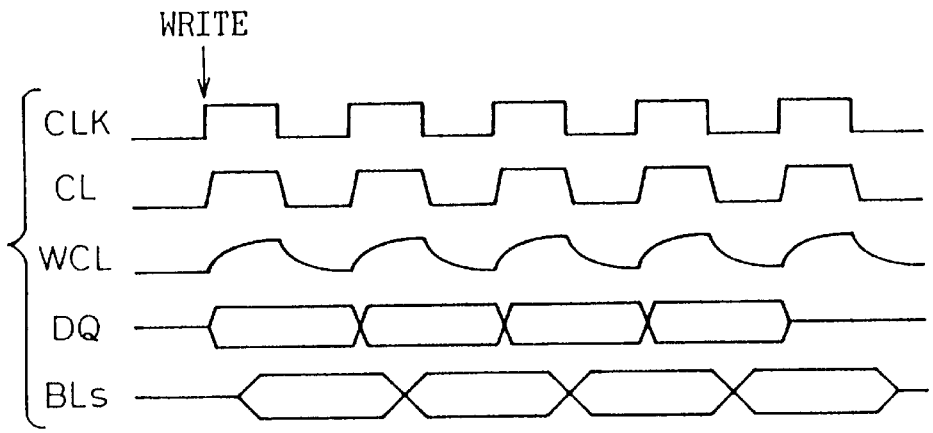
FIG. 6 shows the waveforms of signals related to a column selection operation according to the prior art.

FIG. 6 shows the waveforms of a column selection signal, WCL signal, write data DQ, and bit line signals related to a column selection operation according to the prior art. Compared with the column selection signal CL, the WCL signal is delayed to delay the bit line signals.

Delay in the WCL lines causes delay in the bit lines. Such delay is an obstacle to improve the operation speed of the memory, and therefore, must be minimized.

Figure 7:
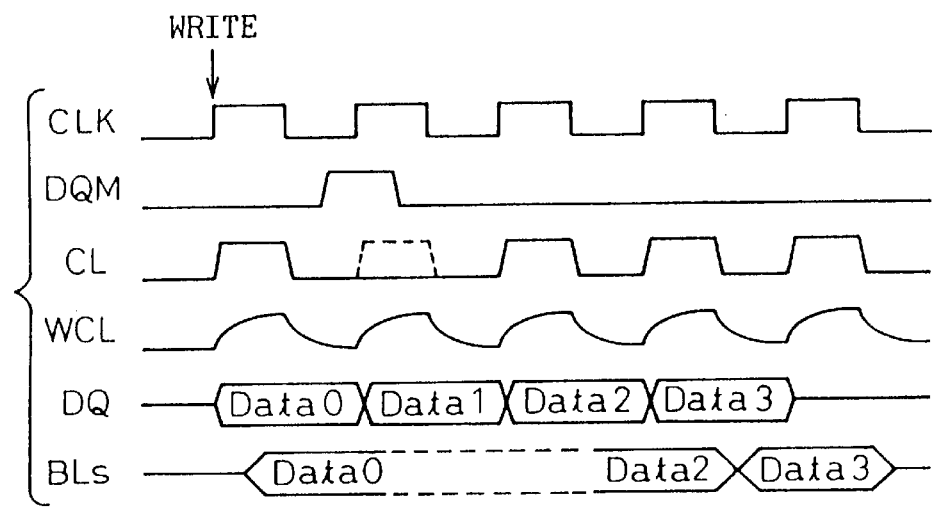
FIG. 7 shows the waveforms of signals related to a masking operation according to the prior art.

FIG. 7 shows the waveforms of signals related to the masking function according to the prior art. When the mask data DQM is provided, a column selection signal for driving corresponding sense amplifiers is stopped. As a result, write data Data1 is not written to a corresponding bit-line pair, which holds the preceding data. The process of stopping the column selection signal according to the mask data DQM is carried out by the logic circuit 16, pre-decoder 15, and column decoder 12, to delay the operation speed of the column address signal system.

A semiconductor memory according to the first aspect of the present invention inserts buffers in a path for the WCL signal.

The semiconductor memory of the first aspect inputs and outputs data in synchronization with an external clock signal. The memory has memory cells arranged in arrays, direct-type sense amplifiers arranged in every column of the memory cell arrays, for writing and reading data to and from an accessed memory cell, column selection lines for selecting sense amplifiers in a column that involves the accessed memory cell, and write-only column selection lines for selecting sense amplifiers in a row that involves the accessed memory cell when writing data to the accessed memory cell. Sense amplifiers in each row are grouped into sense amplifier blocks. The write-only column selection lines consist of first write-only column selection lines for selecting sense amplifier blocks in a row that involves the accessed memory cell to which data is written, and second write-only column selection lines for selecting sense amplifiers in the selected sense amplifier blocks. The memory also has local drivers for applying a selection signal to the second write-only column selection lines according to a selection signal from the first write-only column selection line.

This memory carries out a data write access to a memory cell related to an intersection of a column selection line and a second write-only column selection line.

The memory may have an input terminal serving for a masking function. The terminal is used to receive mask data that specifies bits among write data that are not written to the memory. In this case, first drivers for driving the first write-only column selection lines may prohibit, according to the mask data, at least part of sense amplifier blocks in a row that involves an accessed memory cell, from being selected. Instead, the local drivers may prohibit, according to the mask data, at least part of sense amplifiers in a selected sense amplifier block from being selected, without regard to a selection signal from the first write-only column selection lines.

The memory employs the write-only column selection lines consisting of the first write-only column selection lines for selecting sense amplifier blocks in a row that involves an accessed memory cell to which data is written, and the second write-only column selection lines for selecting sense amplifiers in the selected sense amplifier blocks. The local drivers drive only the second write-only column selection lines, and therefore, the load on the local drivers is small. This minimizes delay in the write-only column selection lines and improves the operation speed of the memory.

Generally, semiconductor memories such as DRAMs are required to operate at high speed particularly when reading data therefrom. Namely, the speed of reading data out of a memory determines the operation speed of the memory. Accordingly, the write masking logic inserted in the column selection path may be used for a read masking process. Inserting the masking logic into a read path, which is a critical path, slows the operation speed of the memory. In particular, SDRAMs transmit read data to an output circuit and accumulate the read data in a latch circuit adjacent to the output circuit. The output circuit sequentially outputs the accumulated data in response to an output clock signal. In this case, transmitting the read data to the latch circuit must be complete before the output clock signal is applied to the output circuit. It is necessary, therefore, to reduce the number of logic stages up to the latch circuit, to improve the speed of reading data. To achieve this, the first aspect of the present invention carries out the write masking operation in response to a first or second write-only column selection signal. The first aspect carries out the read masking operation in the output circuit. Namely, the first aspect inserts no masking logic in the read path, to improve the speed of reading data.

Inserting the write masking logic into the path for the write-only column selection signal increases delay in this signal. This causes no problem in the first aspect because the first aspect minimizes delay in the write-only column selection lines.

The structure of carrying out the masking operation with the use of the write-only column selection signal is applicable to the prior art that arranges no buffers in the middle of the write-only column selection lines, if delay in the write-only column selection lines is sufficiently small.

The semiconductor memory according to the first aspect will be explained in detail with reference to the drawings.

Figure 8:
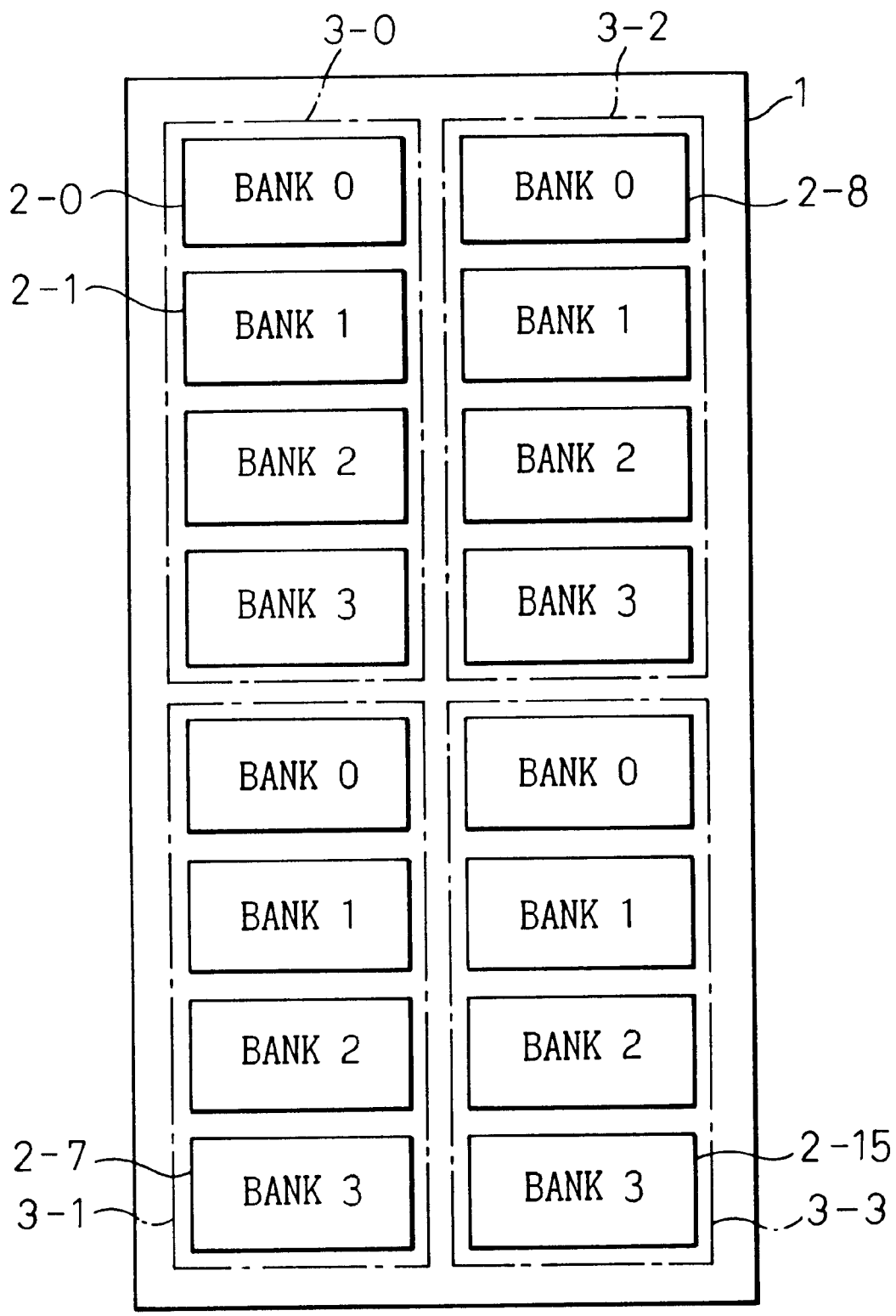
FIG. 8 shows a bank structure of a semiconductor memory according to a first aspect of the present invention.

FIG. 8 shows the semiconductor memory of the first aspect of the present invention. This memory is a 256-megabit SDRAM divided into sixteen 16-megabit blocks 2-0 to 2-15. Four blocks form a group, and there are four groups 3-0 to 3-3. In each group, the four blocks serve as banks 0 to 3, respectively. The blocks of the same bank are simultaneously accessed.

Figure 9:
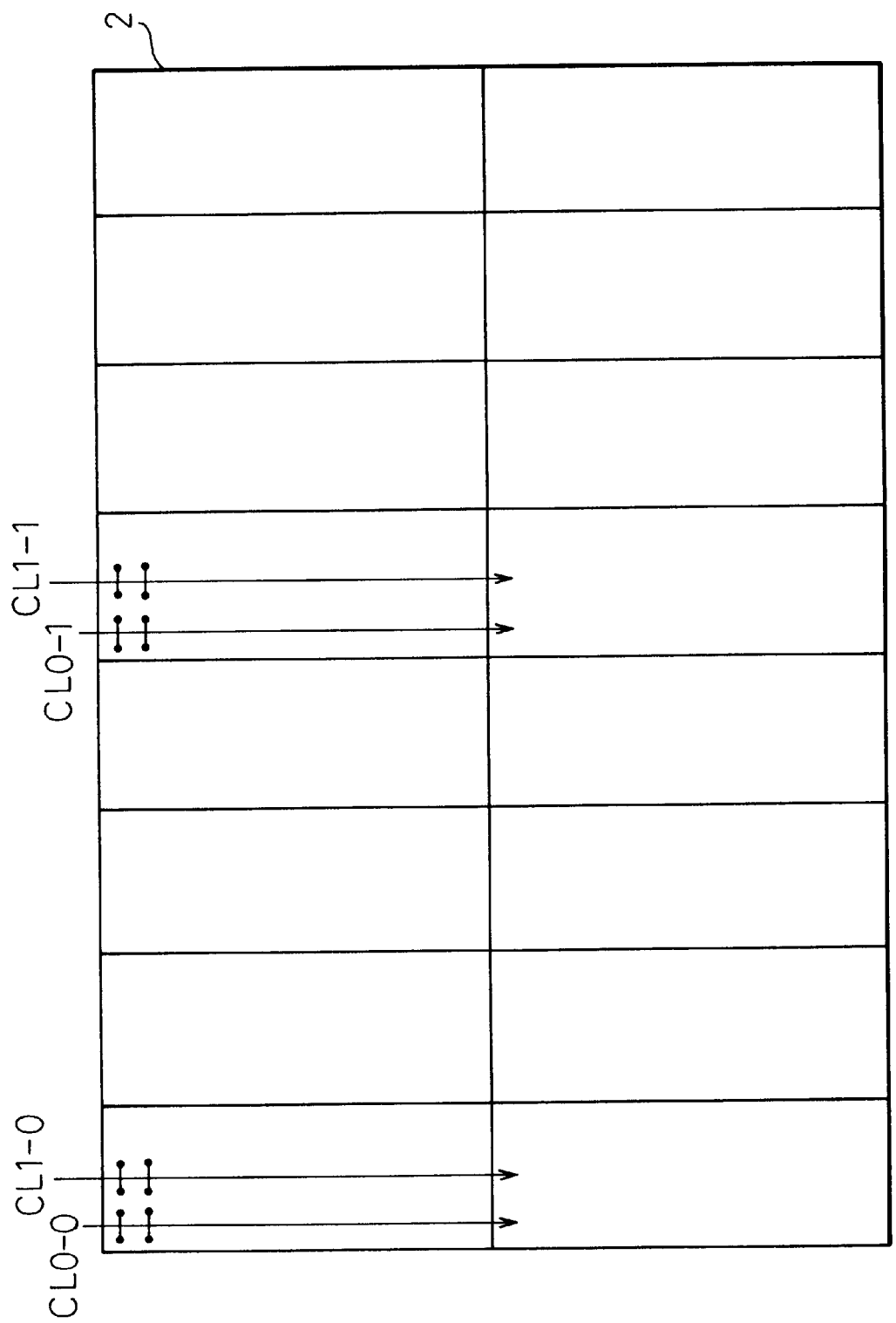
FIG. 9 shows a column selection line selecting operation in the structure of FIG. 8.

FIG. 9 explains an operation of selecting column selection lines in the structure of FIG. 8. In each of the blocks of an accessed bank, two column selection lines such as CL0-0 and CL1-0, and CL0-1 and CL1-1 are simultaneously selected. Each column selection line selects four sense amplifiers as shown in FIG. 5. Accordingly, eight sense amplifiers are simultaneously selected in one block. Namely, 32 bits are accessed in the four blocks of a given bank.

Figure 10:
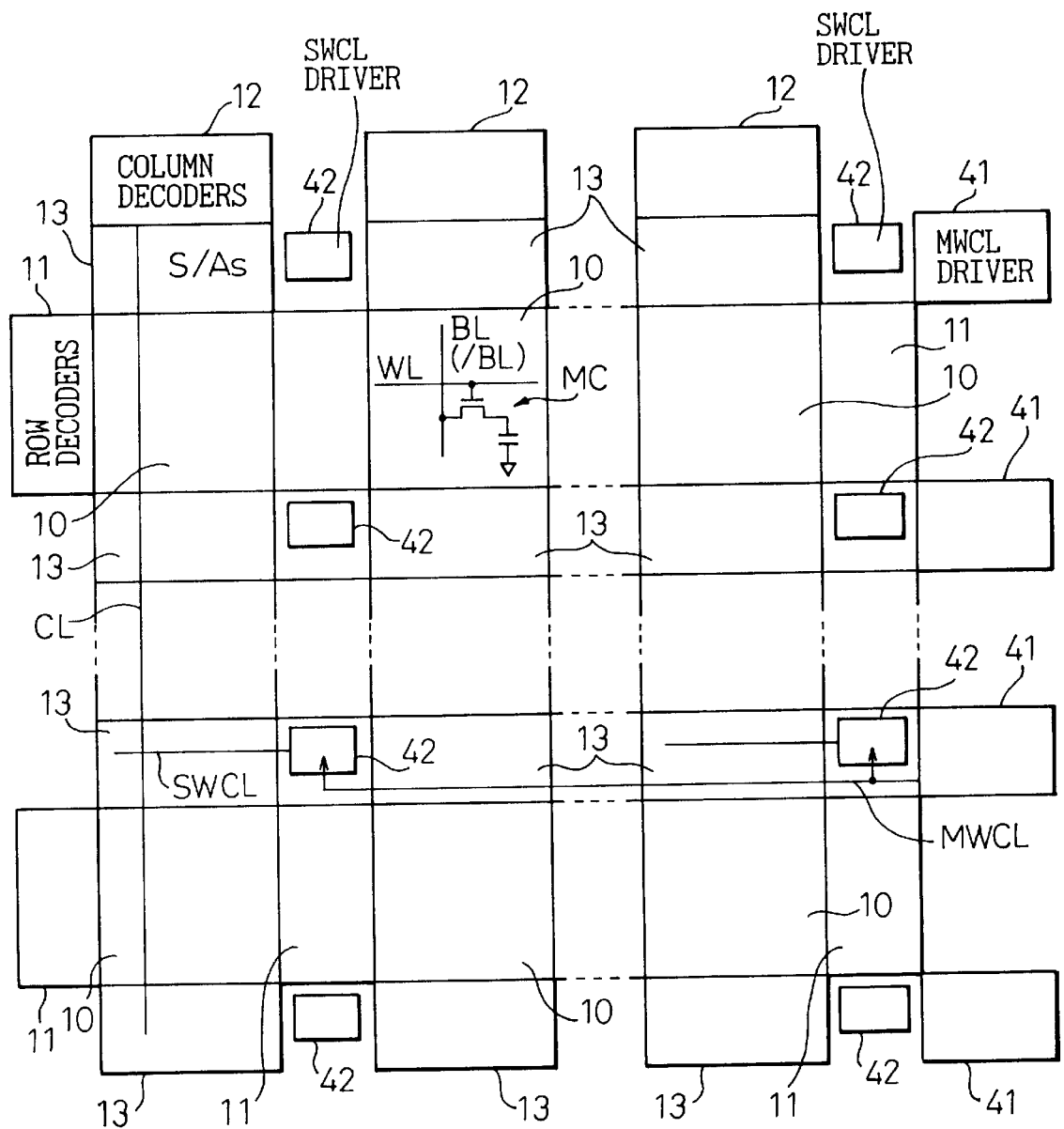
FIG. 10 shows arrays of memory cells in a block of the memory of FIG. 8.

FIG. 10 shows blocks and arrays of memory cells in the memory of the first aspect. This corresponds to the structure of FIG. 1. The first aspect is characterized by secondary write-only column selection line drivers (hereinafter referred to as SWCL drivers) 42 for selecting sense amplifiers.

Figure 11:
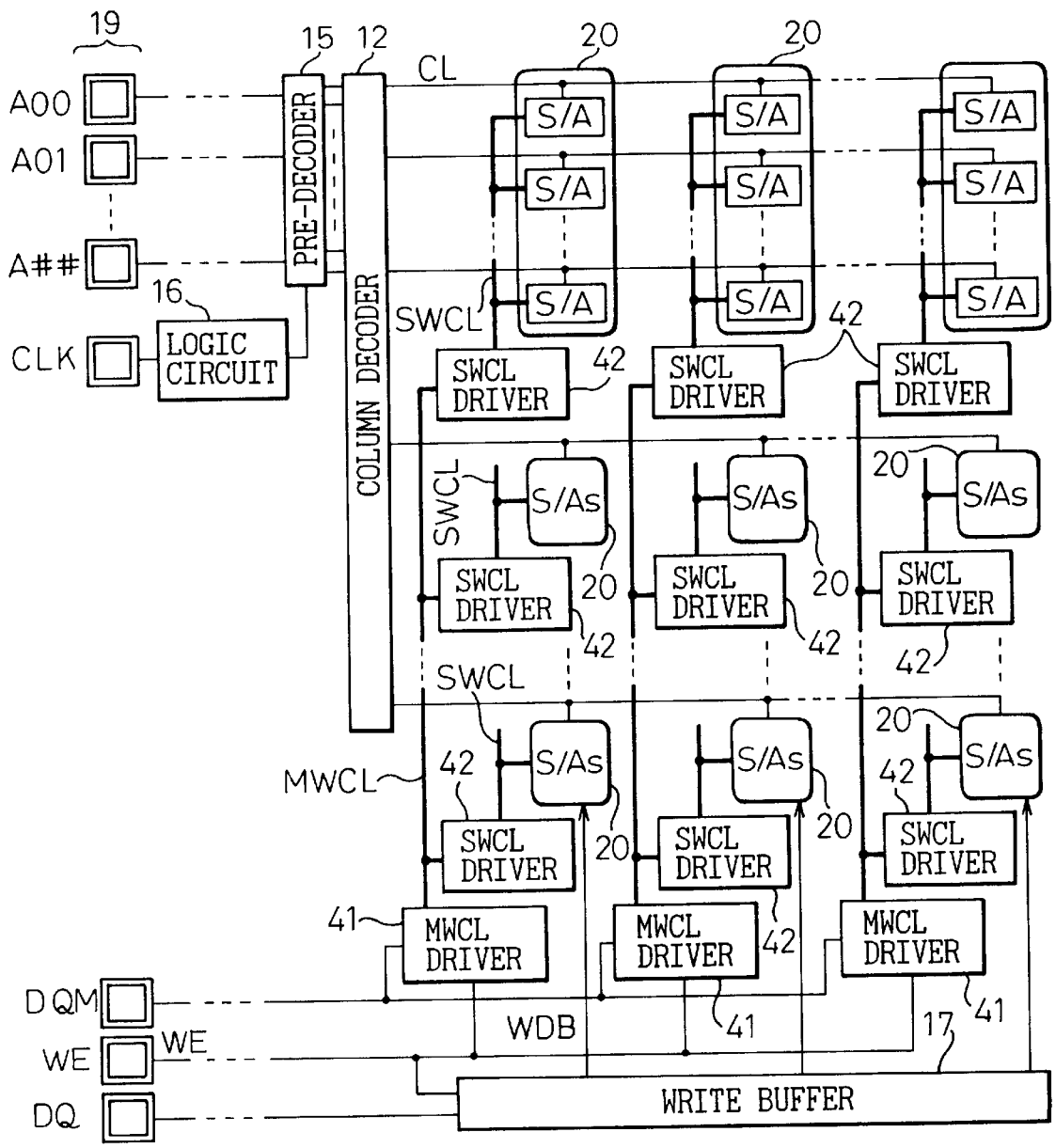
FIG. 11 shows a sense amplifier driving system of the memory of FIG. 10.

FIG. 11 shows a sense amplifier driving system in the memory of FIG. 10. The memory has main write-only column selection line drivers (hereinafter referred to as MWCL drivers) 41 and the SWCL drivers 42 in place of the WCL drivers 14 of the prior art of FIG. 4. In addition, the first aspect supplies mask data DQM to the MWCL drivers 41. The MWCL drivers 41 are arranged at the positions where the prior art arranges the WCL drivers 14, and the SWCL drivers 42 at the areas between sense amplifier blocks 20, respectively.

The MWCL driver 41 is provided for each row of sense amplifiers 13, and the SWCL driver 42 is provided for each sense amplifier block 20 that contains a given number of sense amplifiers 13 that are arranged in the same row. The MWCL driver 41 issues a selection signal to a corresponding main write-only column selection line (hereinafter referred to as MWCL line), if the MWCL driver 41 belongs to a row that involves memory cells accessed for data write. In response to the selection signal from the MWCL line, the SWCL drivers 42 connected to the MWCL line amplify the selection signal and supply the amplified signal to their secondary write-only column selection lines (hereinafter referred to as SWCL lines).

The 256-megabit SDRAM of FIG. 8 is divided into 16 blocks each containing 16 megabits. Memory cells in each block are arranged in a matrix of 2048 (2K) bits by 8192 (8K) bits, i.e., 2048 bits in a horizontal direction and 8192 bits in a vertical direction. These memory cells in each block are grouped into memory cell arrays 10, which are 8 in the horizontal direction and 16 in the vertical direction. Each row of the memory cell arrays 10 involves 2048 bit line pairs, and therefore, 2048 sense amplifiers are arranged in two rows along the opposite sides of the row of memory cell arrays 10. In each row of the sense amplifiers, 128 sense amplifiers are grouped into a sense amplifier block 20, and there are eight sense amplifier blocks 20 in each row. As a result, each MWCL driver 41 drives eight SWCL drivers 42, and each SWCL driver 42 drives 128 sense amplifiers. Compared with the prior art, the number of gates driven by the MWCL driver 41 or SWCL driver 42 is very small, and therefore, the operation speed of the memory of the first aspect is faster than that of the prior art even if the first aspect must drive the two-stage system involving the MWCL and SWCL drivers 41 and 42.

Figure 12:
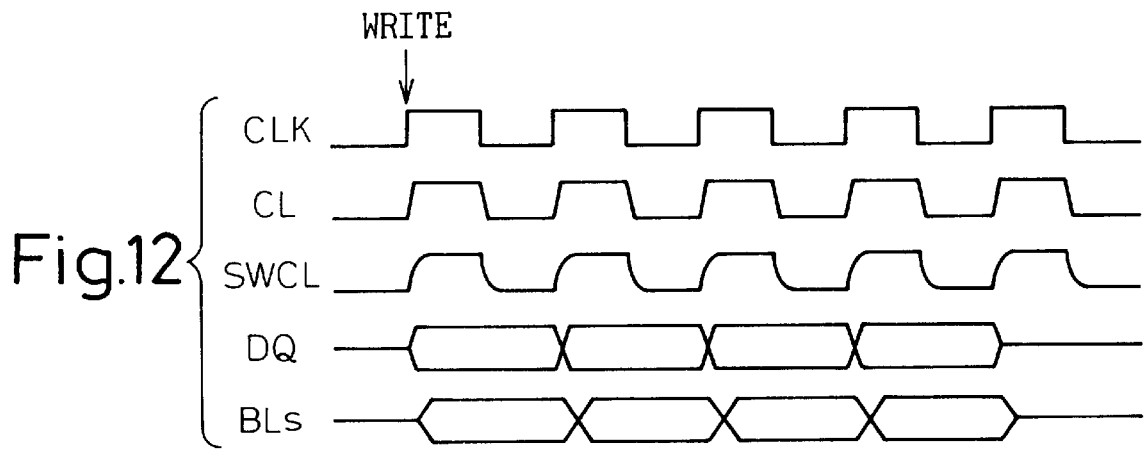
FIG. 12 shows the waveforms of signals related to a column selecting operation in the system of FIG. 11.

FIG. 12 shows the waveforms of signals related to a masking operation carried out in the memory of the first aspect. Compared with the prior art of FIG. 6, a selection signal in the SWCL line changes quickly, and signals in bit lines BLs also quickly change in response to write data. In this way, the first aspect improves the write speed of the memory.

In FIG. 11, mask data DQM is supplied to the MWCL drivers 41. Receiving the mask data DQM, even the MWCL driver 41 that is in a row where accessed memory cells are present generates no selection signal. As a result, 8-bit data for the block in question is not written into the accessed memory cells. Namely, the masking operation is carried out 8 bits by 8 bits (one byte).

Figure 13:
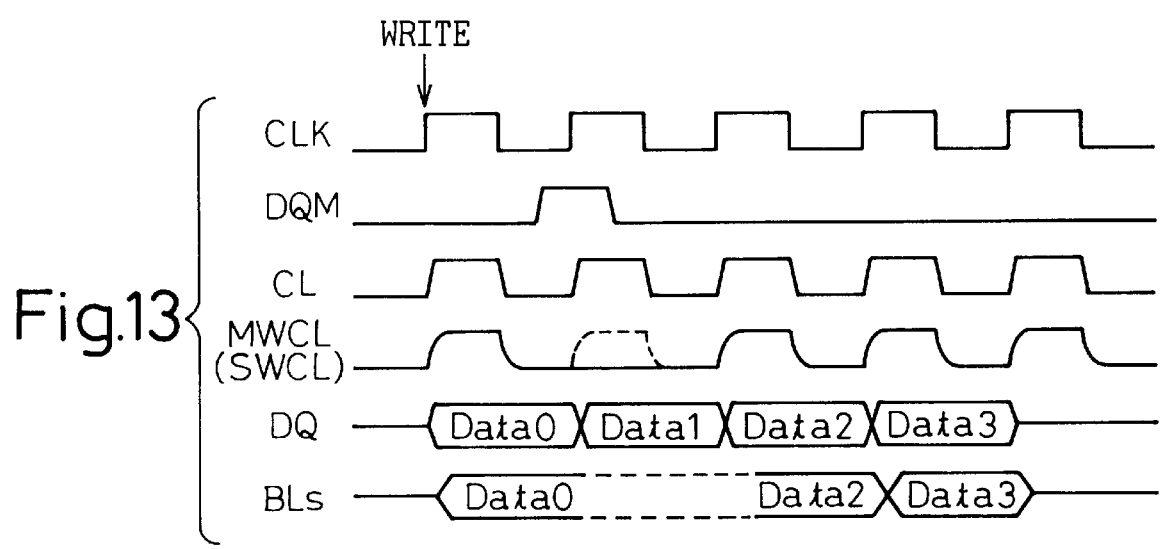
FIG. 13 shows the waveforms of signals related to a masking operation in the system of FIG. 11.

FIG. 13 shows the waveforms of signals related to an operation of selecting a column when masking a part of write data in the memory of the first aspect. When the mask data DQM is provided, a selection signal in a column selection line CL and a selection signal in an MWCL line change as shown in FIG. 13. When the mask data DQM is provided, no selection signal is applied to the MWCL line. According to the first aspect, delay in selection signals in the MWCL and SWCL lines is small and, therefore, the logic circuit for masking write data is inserted into the path of the MWCL and SWCL lines without making the path critical. The first aspect can make the operation speed of the memory faster than the prior art.

Although the first aspect supplies the mask data DQM to the MWCL drivers 41 to entirely mask the corresponding block, many modifications are feasible. It is preferable to mask write data with a smaller unit of bits. Various masking techniques according to the first aspect of the present invention will be explained.

Figure 14:
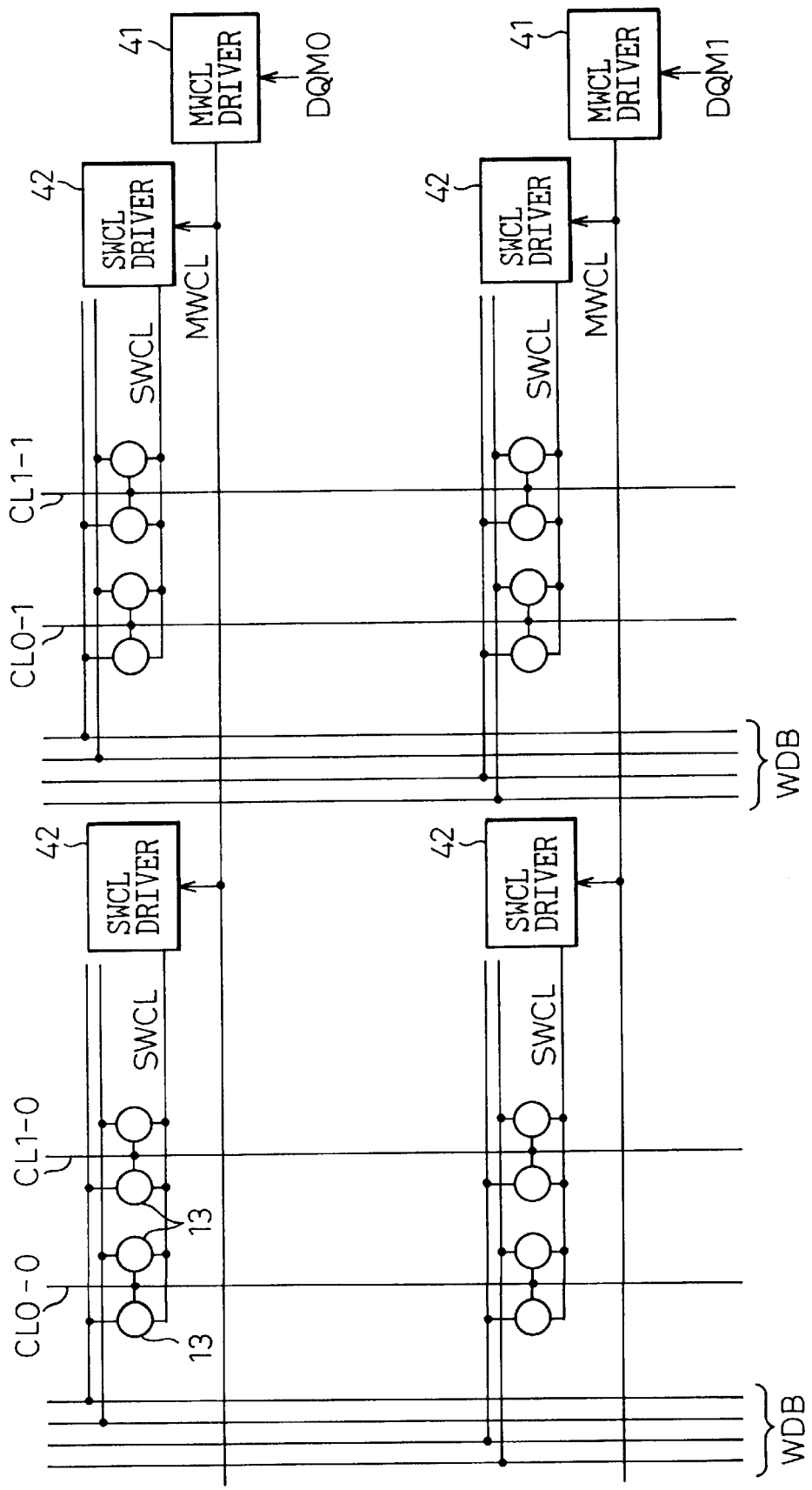
FIG. 14 shows a masking structure applicable to the memory of the first aspect.

FIG. 14 shows a masking structure applicable to the memory of the first aspect. Different mask data DQM0 and DQM1 are alternately supplied to the MWCL drivers 41. When the mask data DQM0 is asserted, first and second parts of write data are masked, and when the mask data DQM1 is asserted, third and fourth parts of write data are masked.

Figure 15:
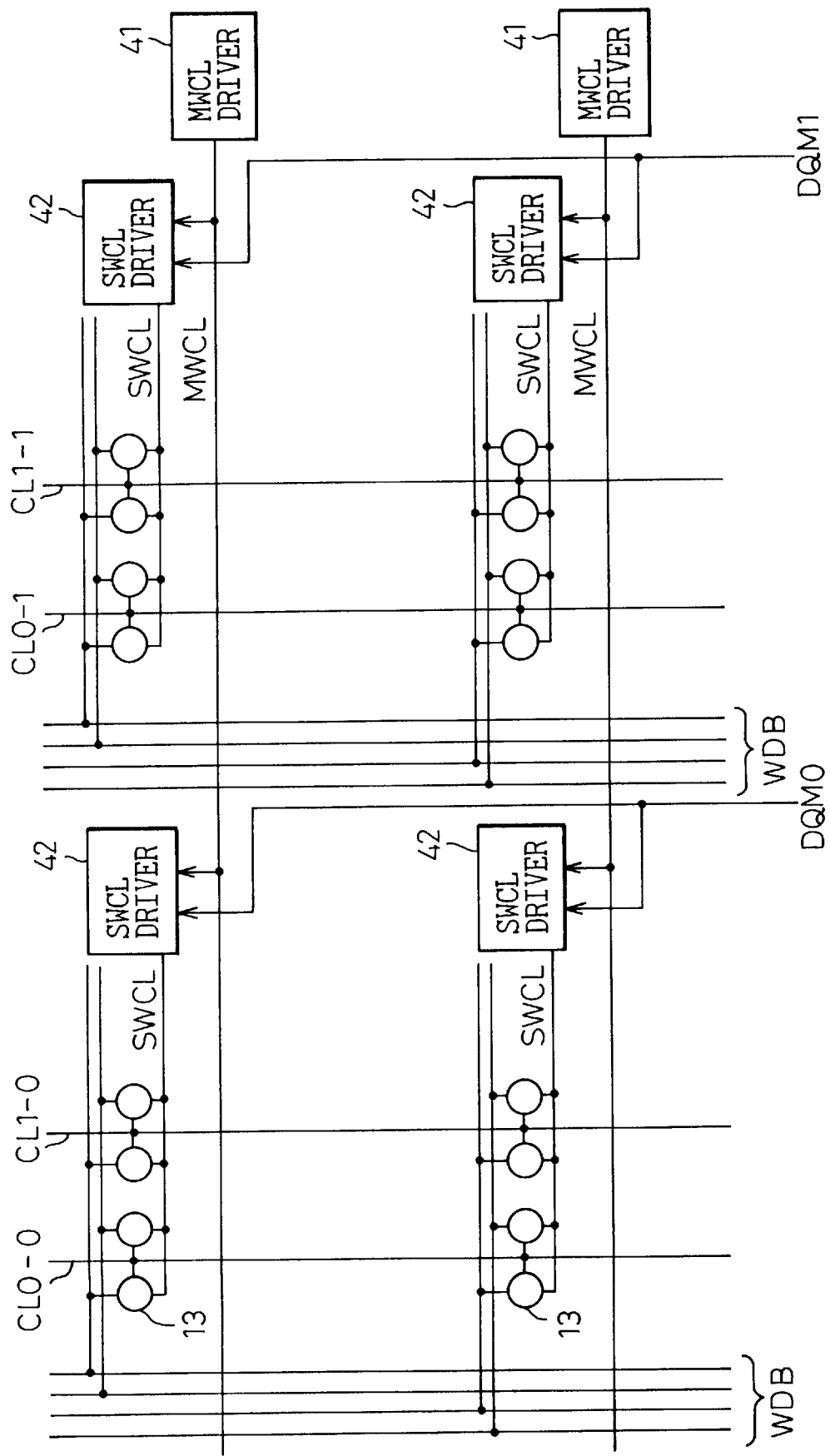
FIG. 15 shows another masking structure applicable to the memory of the first aspect.

FIG. 15 shows another masking structure applicable to the memory of the first aspect. No mask data is supplied to the MWCL drivers 41, and different mask data DQM0 and DQM1 are supplied to the SWCL drivers 42. As shown in FIG. 9, two column selection lines are asserted in each block. In FIG. 15, the SWCL drivers 42 on the left side receive the mask data DQM0, and those on the right side receive the mask data DQM1, to mask four bits at a time.

Figure 16:
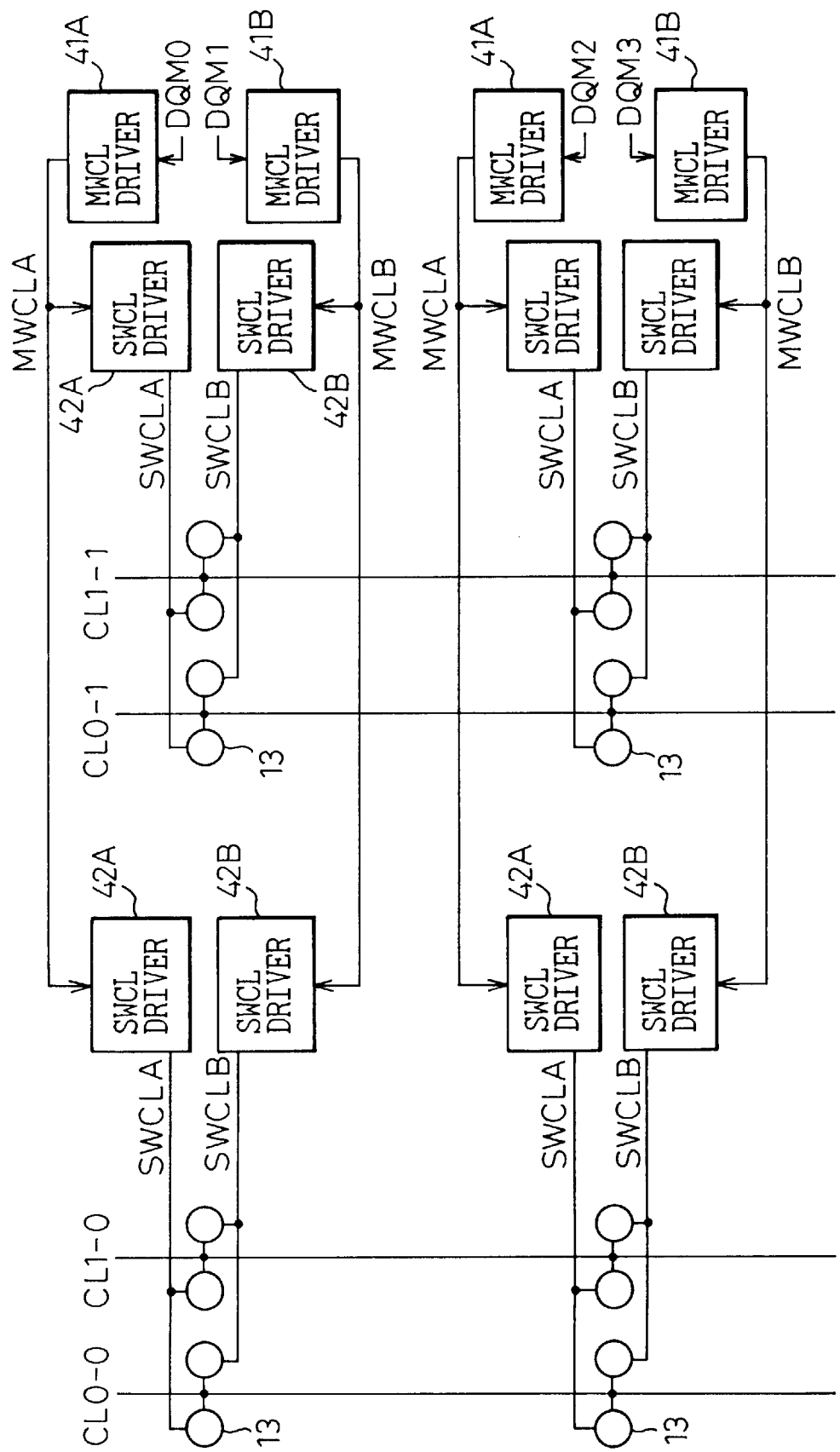
FIG. 16 shows still another masking structure applicable to the memory of the first aspect.

FIG. 16 shows still another masking structure applicable to the memory of the first aspect. Each SWCL driver 42 arranged for a sense amplifier block 20 is divided into SWCL drivers 42A and 42B, and two sense amplifiers connected to a single column selection line CL in the same sense amplifier block 20 are connected to the SWCL drivers 42A and 42B, respectively. Each MWCL driver 41 is divided into MWCL drivers 41A and 41B, and the SWCL drivers 42A are connected to the MWCL driver 41A, and the SWCL drivers 42B to the MWCL driver 41B. As a result, one in every four bits can be masked.

The above masking structures may be combined in various ways to provide various masking structures.

The first aspect supplies a signal corresponding to a decoded row signal to the MWCL drivers, and the MWCL drivers that are on each side of a row of memory cell arrays that involves a word line to be accessed provide a selection signal to activate all SWCL drivers connected to these MWCL drivers. Then, the activated SWCL drivers activate all sense amplifier blocks connected thereto. Namely, all sense amplifiers contained in the activated sense amplifier blocks are activated. Among the activated sense amplifiers, the actually used ones are only those that receive a column selection signal. Activating sense amplifiers increases power consumption, and therefore, it is preferable not to activate sense amplifiers that are not required.

Figure 17:
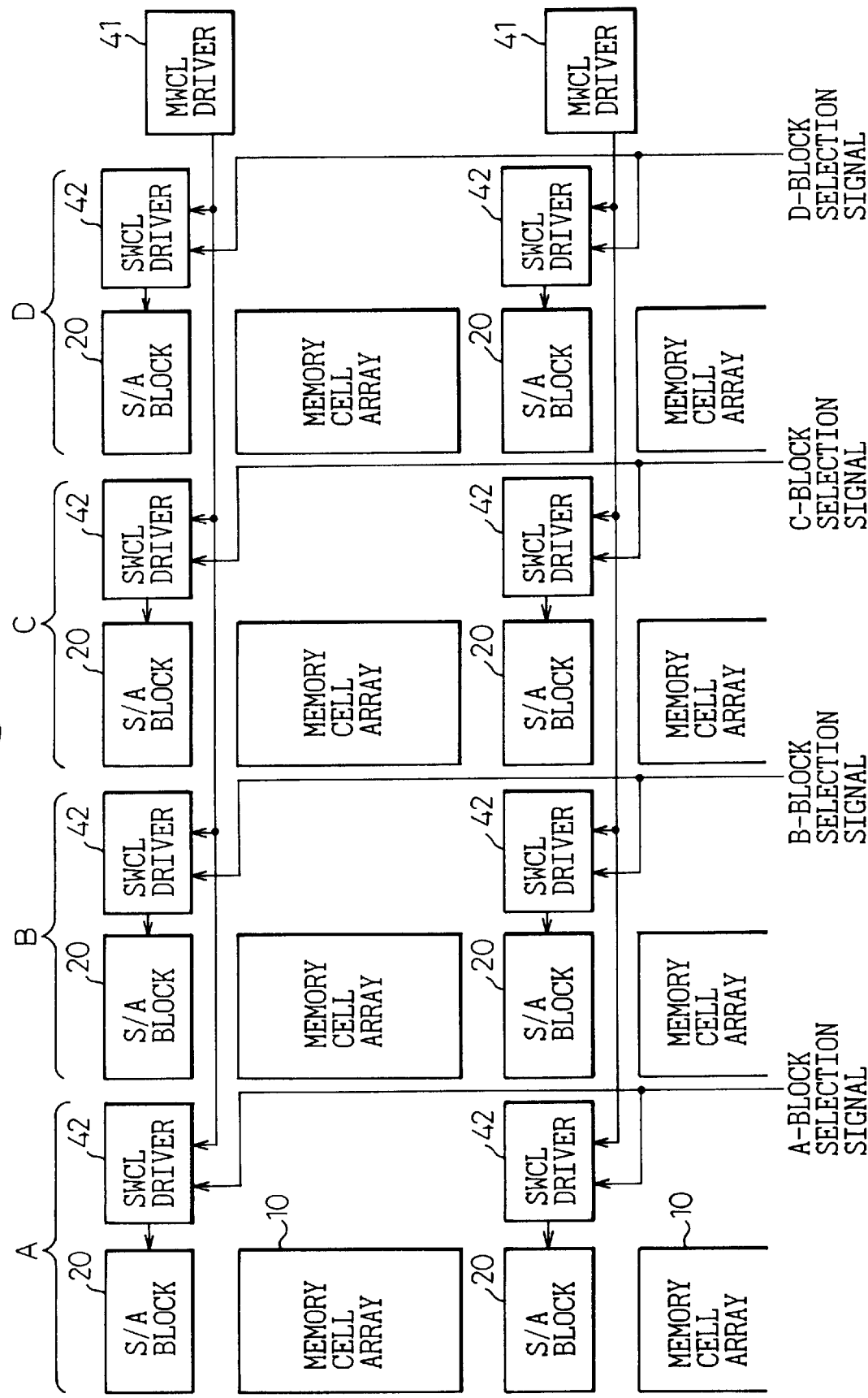
FIG. 17 shows a semiconductor memory having a block selecting function according to a modification of the first aspect.

FIG. 17 shows a semiconductor memory according to a modification of the first aspect of the present invention, with an SWCL signal providing a column block selecting function. This modification is capable of reducing the power consumption of the MWCL-SWCL structure. The modification divides each memory cell array 10 into a row of memory cell blocks A, B, C, and D and arranges SWCL drivers 42 on each horizontal side of each memory cell block. Each column of the SWCL drivers 42 receives a block selection signal. The block selection signal is a kind of a column selection signal and is generated in the middle of decoding a column address signal into a column selection signal. Each SWCL driver 42 provides sense amplifiers related thereto with an SWCL signal only when it receives an MWCL signal from the MWCL driver 41 and the block selection signal. As a result, only a sense amplifier block that involves memory cells to be accessed is activated, and the other sense amplifier blocks are kept inactive, to reduce the power consumption of the memory.

In this way, the semiconductor memory (SDRAM) of the first aspect achieves a write operation at high speed. The first aspect inserts the write masking function into the write-only path instead of a read path, to improve the reading speed of the memory. The first aspect achieves the write data masking operation in the path of the MWCL and SWCL lines, to make the operation speed faster than achieving the masking operation in the path of a column selection signal. The first aspect combines an SWCL signal with a block selection signal, to activate only necessary sense amplifiers to reduce the power consumption of the memory.

There is a requirement to provide a simple system for controlling write-only column selection lines (WCL lines) of a semiconductor memory employing direct-type sense amplifiers that are selected with a column selection line CL and a WCL line in a write operation.

A semiconductor memory according to a second aspect of the present invention will be explained.

The second aspect is based on the semiconductor memory of the first aspect whose structure is shown in FIG. 10.

The structure of FIG. 10 has the SWCL drivers 42 for driving the SWCL lines in addition to the structure of FIG. 1.

The sense amplifier driving system for the structure of FIG. 10 is as shown in FIG. 11.

As is apparent from comparison between FIGS. 4 and 11, the system of FIG. 11 employs the MWCL drivers 41, SWCL drivers 42, MWCL lines, and SWCL lines instead of the WCL drivers 14 and WCL lines of FIG. 4. The MWCL drivers 41 are arranged at the positions where the WCL drivers 14 are arranged, and the SWCL drivers 42 are arranged at the sense amplifier blocks 20, respectively.

The mask data DQM of FIG. 11 is supplied to the MWCL drivers 41. After receiving the mask data DQM, even the MWCL driver 41 whose row involves accessed memory cells generates no MWCL signal. Namely, the mask data DQM prevents 8-bit data from being written to the block in question. Namely, write prohibition is carried out 8 bits by 8 bits.

Figure 18:
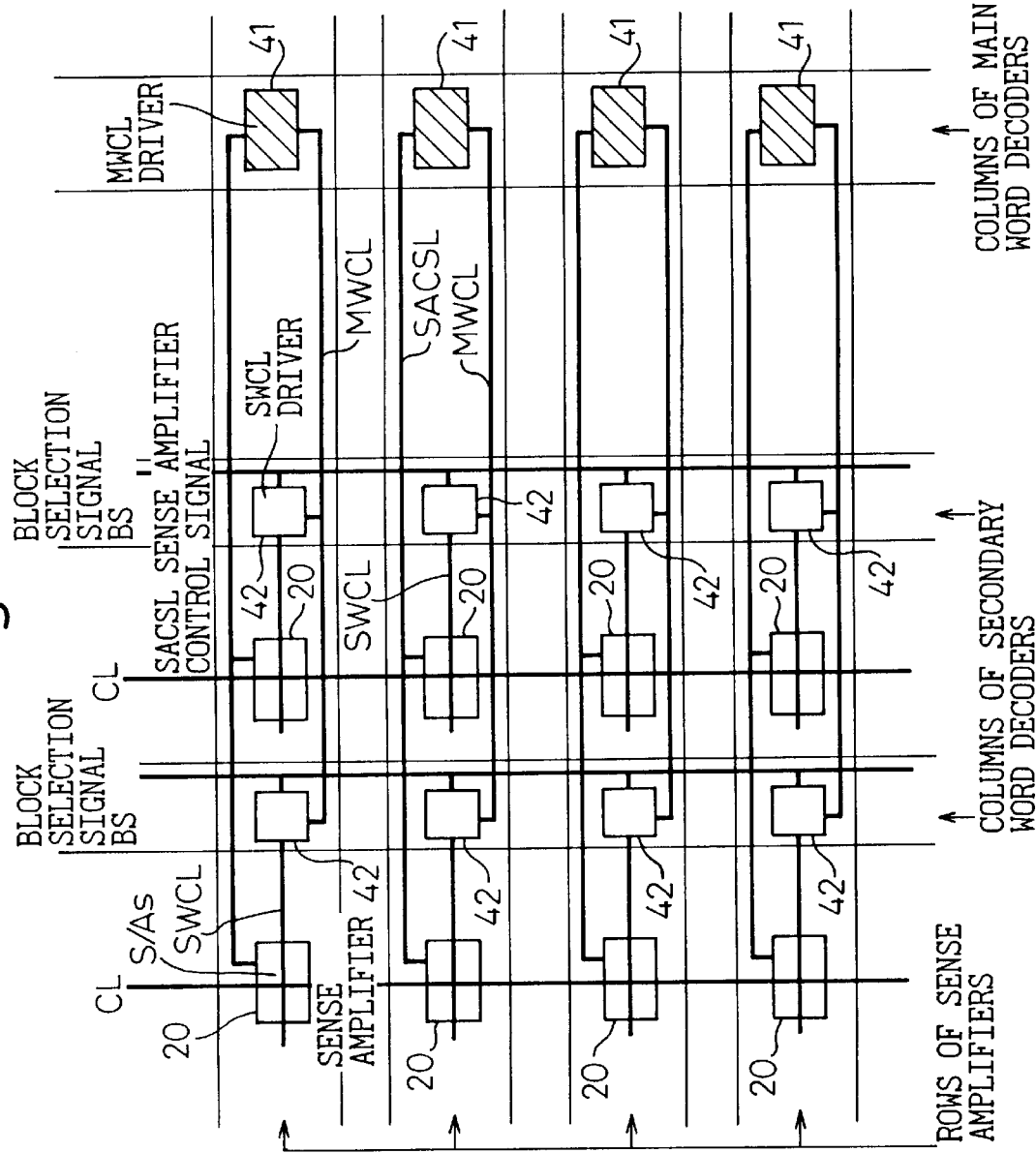
FIG. 18 shows a semiconductor memory according to a second aspect of the present invention.

FIG. 18 is a block diagram showing the semiconductor memory according to the second aspect of the present invention.

The second aspect arranges an MWCL driver 41 for each row of sense amplifiers, and SWCL drivers 42 for sense amplifier blocks 20, respectively. Each block 20 contains a given number of sense amplifiers 13 that are in the same row. Like the WCL driver 14 of FIG. 4, the MWCL driver 41 generates a selection signal if the MWCL driver 41 involves a row of sense amplifier blocks 20 that involves memory cells to be accessed for data write. The selection signal is passed through a corresponding MWCL line. The SWCL drivers 42 connected to the MWCL line in question amplify the selection signal from the MWCL line, and the amplified signal is supplied to corresponding SWCL lines.

The MWCL drivers 41 are arranged at intersections of a main word decoder column and sense amplifier rows. The SWCL drivers 42 are arranged at intersections of secondary word decoder columns and sense amplifier rows. The MWCL lines and SWCL lines are orthogonal to column selection lines CL. In this way, the memory of the second aspect employs an efficient layout.

The memory of the second aspect may be a 256-megabit SDRAM having 8192 (8K) sense amplifiers in a single row. The sense amplifiers are grouped into sense amplifier blocks 20. If each of the blocks 20 contains 256 sense amplifiers, there are 128 sense amplifier blocks 20 in a single row. In this case, each MWCL driver 41 drives 8 SWCL drivers 42, and each SWCL driver 42 drives 128 sense amplifiers. This system greatly reduces the number of gates driven by each of the drivers 41 and 42 compared with the prior art. Accordingly, the memory of the second aspect realizes high-speed operation even with the two-stage driving system employing the MWCL and SWCL drivers.

Figure 19:
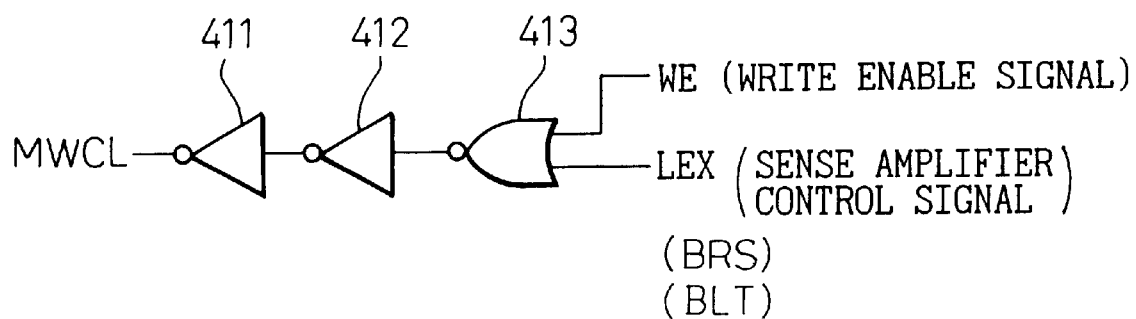
FIG. 19 shows a main write-only column selection driver of the memory of the FIG. 18.

FIG. 19 shows an example of the MWCL driver 41 of FIG. 18.

The MWCL driver 41 has inverters 411 and 412 and a 2-input NOR gate 413, which are connected in series. The NOR gate 413 receives a write enable signal WE and a latch enable control signal LEX for controlling the sense amplifiers 13. Instead of the signal LEX, a bit line precharge activation control signal BRS for controlling the sense amplifiers, or a bit line isolation gate control signal BLT used for the shared sense amplifier system is employable.

In this way, the MWCL driver 41 of the present invention employs signals (LEX, BRS, BLT) for controlling sense amplifiers. This layout is simple and efficient to control the WCL (MWCL, SWCL) lines and involves no increase in the number of signal lines because it uses the existing sense amplifier control signals.

Figure 20:
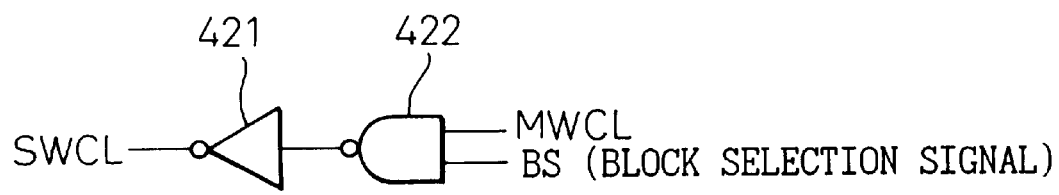
FIG. 20 shows a secondary write-only column selection driver of the memory of FIG. 18.

FIG. 20 shows an example of the SWCL driver 42 of FIG. 18.

The SWCL driver 42 has an inverter 421 and a 2-input NAND gate 422 that are connected in series. The NAND gate 422 receives an MWCL signal from the MWCL driver 41 and a block selection signal BS.

Figure 21:
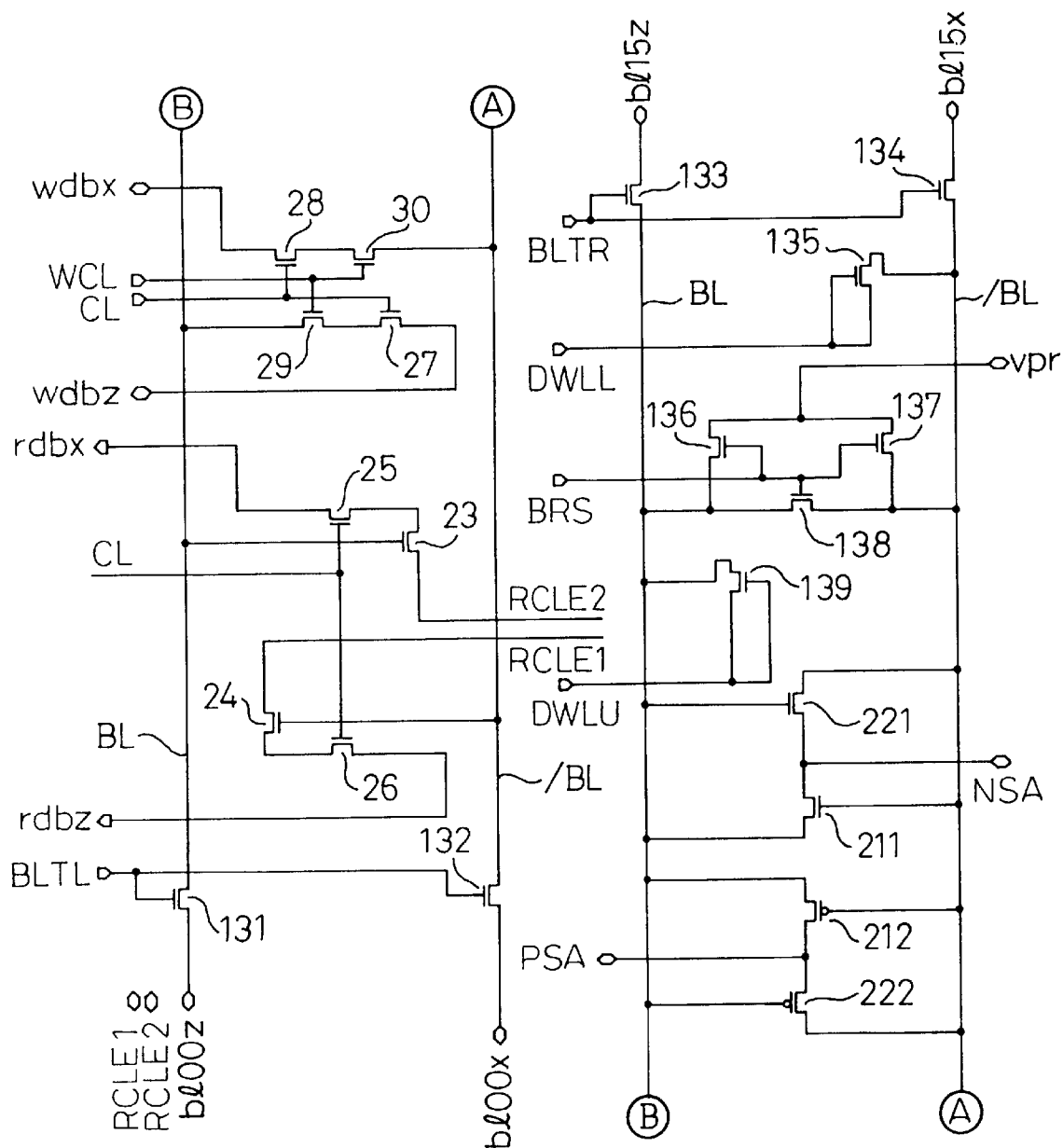
FIG. 21 shows a sense amplifier of the memory of FIG. 18.

FIG. 21 shows an example of the sense amplifier 13 of FIG. 18. Transistors corresponding to those of the direct-type sense amplifier of FIG. 2 are represented by the same reference marks.

An n-channel MOS transistor 211 and a p-channel MOS transistor 212 form an inverter 21. An n-channel MOS transistor 221 and a p-channel MOS transistor 222 form an inverter 22. The inverters 21 and 22 form a flip-flop connected to complementary bit lines BL and /BL. The sources of the transistors 211 and 221 receive a signal NSA, and the sources of the transistors 221 and 222 receive a signal PSA.

The gates of transistors 23 and 24 are directly connected to the bit lines BL and /BL so that data rdbx and rdbz are read through transistors 25 and 26 that are controlled by a column selection line CL. Although the drains of the transistors 23 and 24 of FIG. 2 are grounded, those of FIG. 21 receive signals RCLE2 and RCLE1, respectively.

Data wdbz and wdbx are written to the bit lines BL and /BL through transistors 29 and 30 that are controlled by a WCL line and through transistors 27 and 28 that are controlled by the column selection line CL.

Transistors 131 and 132 correspond to the transistors 31 and 32 of FIG. 3, and transistors 133 and 134 to the transistors 33 and 34 of FIG. 3. The gates of the transistors 131 and 132 receive a bit line isolation gate control signal BLTL. The gates of the transistors 133 and 134 receive a bit line isolation gate control signal BLTR. Only one of the signals BLTL and BLTR is set to high level to close (turn off) the gates 131 and 132, or 133 and 134 for the bit lines BL and /BL of a not used one of the memory cell arrays 10 arranged on each side of the sense amplifiers 13.

Transistors 136, 137, and 138 are used to precharge and short-circuit the bit lines BL and /BL before and after reading data out of a memory cell. When a bit line precharge activation control signal BRS supplied to the gates of the transistors 136, 137, and 138 becomes high, these transistors short-circuit the bit lines BL and /BL and apply a reference voltage vpr thereto. Dummy word line signals DWLL and DWLU control transistors 135 and 139 to read data from a memory cell and easily produce a potential difference between the bit lines BL and /BL.

Figure 22:
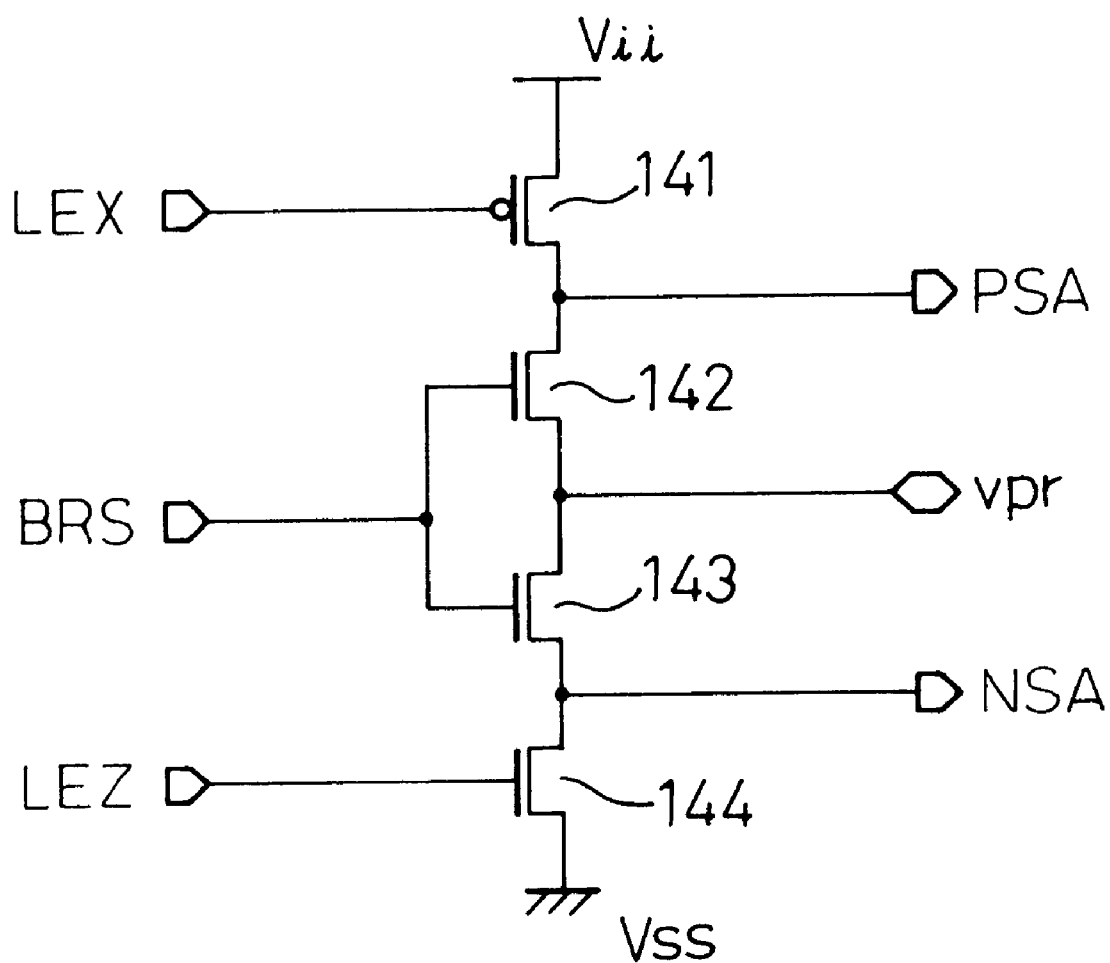
FIG. 22 shows a generator for generating signals for the sense amplifier of FIG. 21.

FIG. 22 shows an example of a generator for generating the signals used by the sense amplifier of FIG. 21.

The generator has a p-channel MOS transistor 141 and n-channel MOS transistors 142, 143, and 144. The generator receives complementary latch enable control signals LEX and LEZ and a bit line precharge activation control signal BRS and generates the signal PSA supplied to the sources of the transistors 212 and 222, the signal NSA supplied to the sources of the transistors 211 and 221, and the reference voltage vpr.

Figure 23:
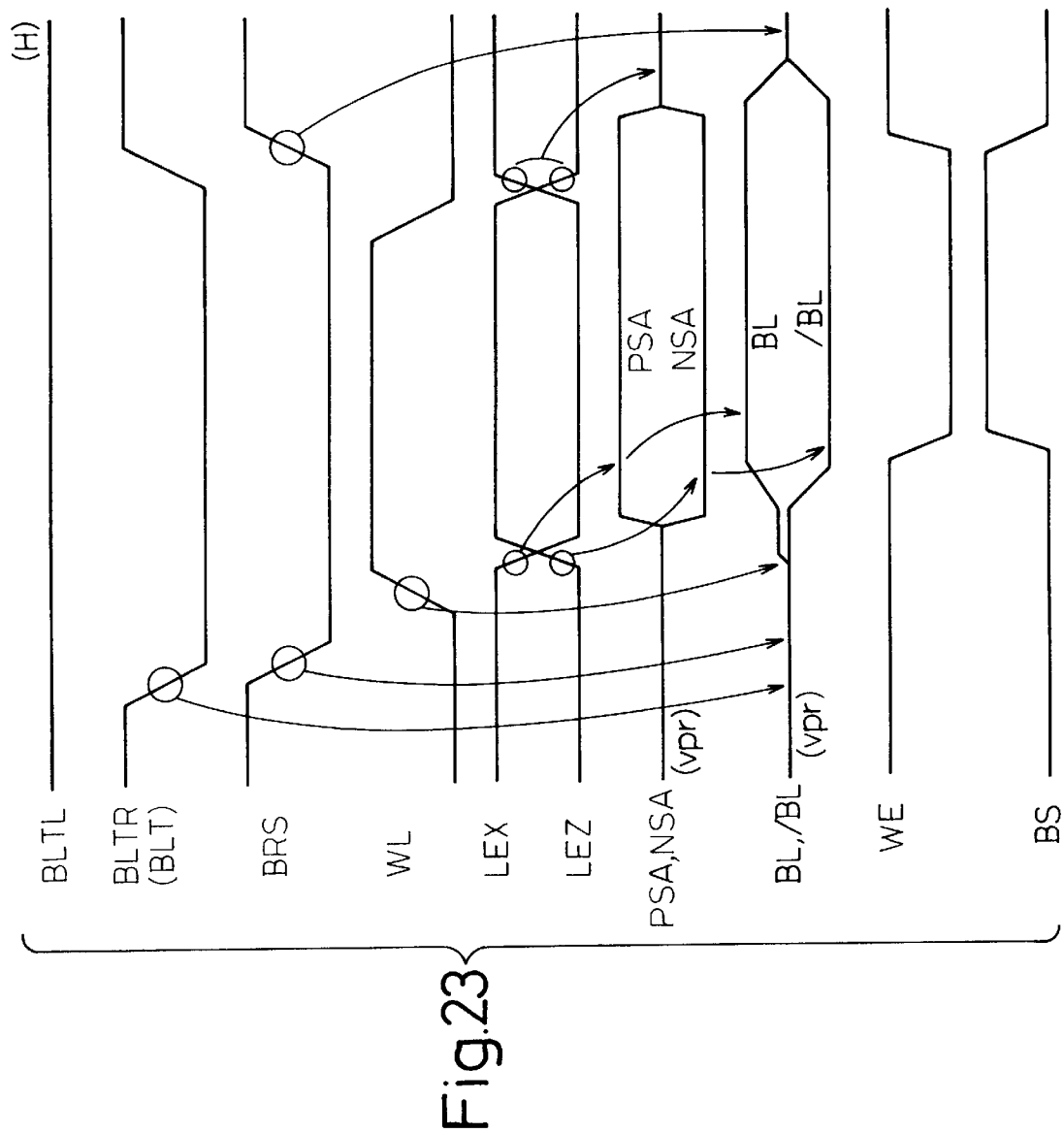
FIG. 23 shows the timing of signals in the sense amplifier of FIG. 21.
Figure 24:
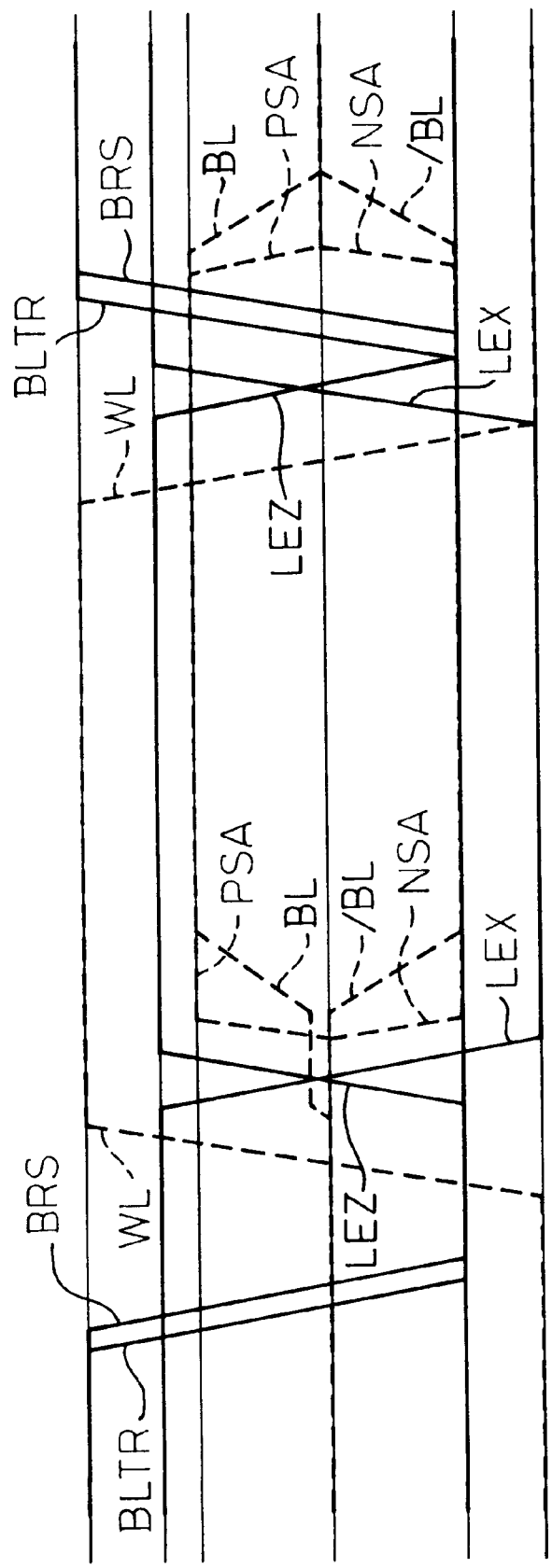
FIG. 24 shows the timing of the signals of FIG. 23.

FIG. 23 shows the timing of the signals in the sense amplifier of FIG. 21 when carrying out a read operation, and FIG. 24 shows the timing of the signals of FIG. 23.

The read operation of the sense amplifier of FIG. 21 employing the shared sense amplifier system will be explained. The bit-line precharge activation control signal BRS changes from high to low to turn off the transistors 135, 137, and 138. This releases the precharge (short-circuited) state of the bit lines BL and /BL. The bit line isolation gate control signal BLTR (BLT) changes from high to low to turn off the transistors 131 and 132. This cuts the bit lines BL and /BL. At this time, the bit-line isolation gate control signal BLTL is kept at high to keep the transistors 133 and 134 on. Through the transistors 133 and 134, the bit lines BL and /BL are connected to the memory cell array 10 that is connected to the transistors 133 and 134, thereby reading data out of an accessed memory cell contained in this memory cell array 10.

A signal WL to a selected word line changes from low to high. The bit lines BL and /BL and the selected word line select the memory cell, and data is read out of the memory cell. Namely, the bit lines BL and /BL produce a level difference with respect to the reference voltage vpr. This changes the latch enable signals LEZ and LEX to change the signal PSA (FIG. 22). This activates the flip-flop (211, 212, 221, 222) to amplify the level difference between the bit lines. In FIG. 23, "WE" is a write enable signal, and "BS" is a block selection signal.

Figure 25:
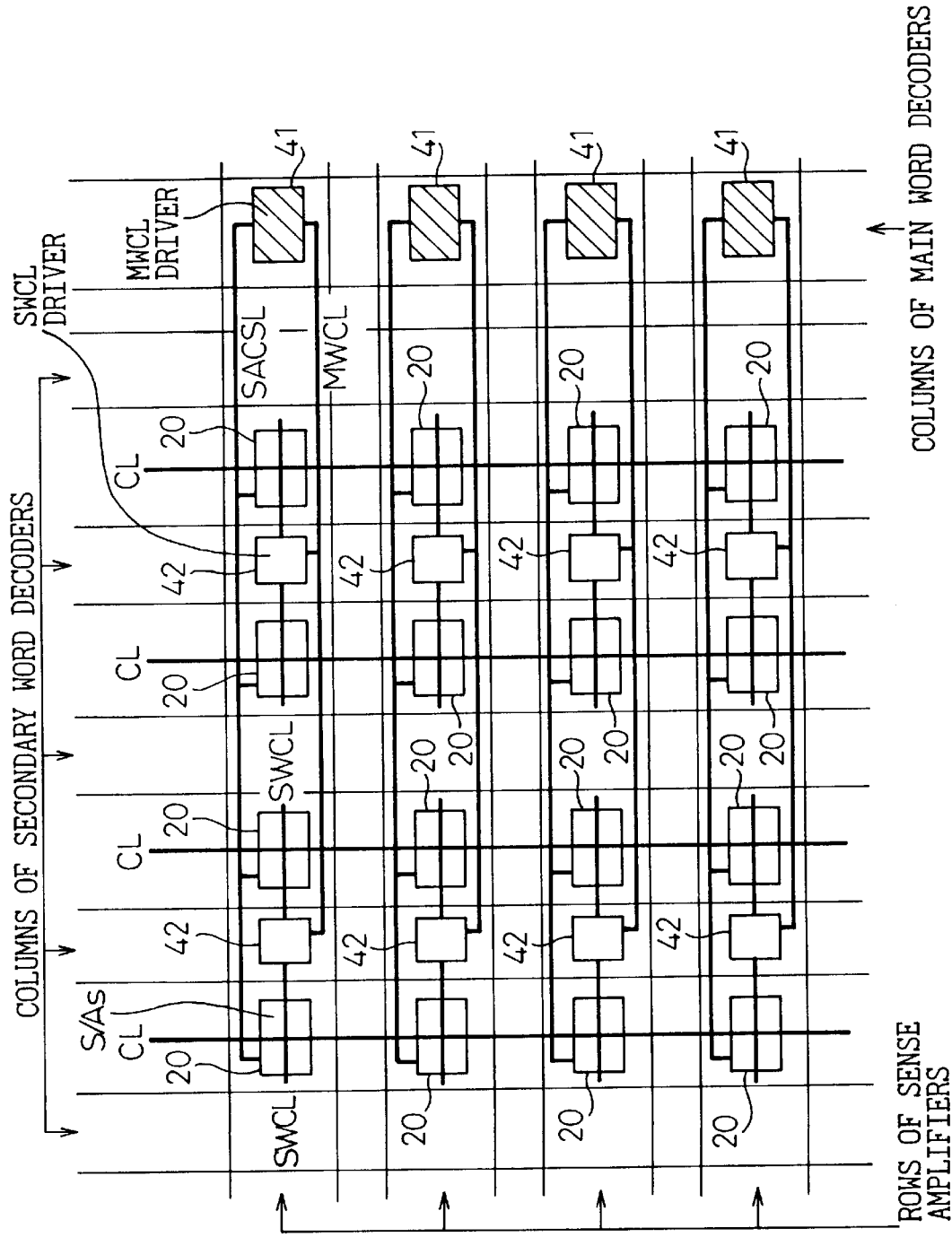
FIG. 25 shows a semiconductor memory according to a modification of the second aspect.

FIG. 25 shows a semiconductor memory according to a modification of the second aspect.

As is apparent from comparison between FIGS. 18 and 25, the memory of FIG. 18 arranges the SWCL drivers 42 at intersections of secondary word decoder columns and sense amplifier rows. On the other hand, the modification of FIG. 25 arranges the SWCL drivers 42 at intersections of every second secondary word decoder column and sense amplifier rows. The SWCL drivers 42 may be arranged at intersections of every "N"th secondary word decoder column and sense amplifier rows. Here, "N" is any natural number (1, 2, 3, . . . ).

Figure 26:
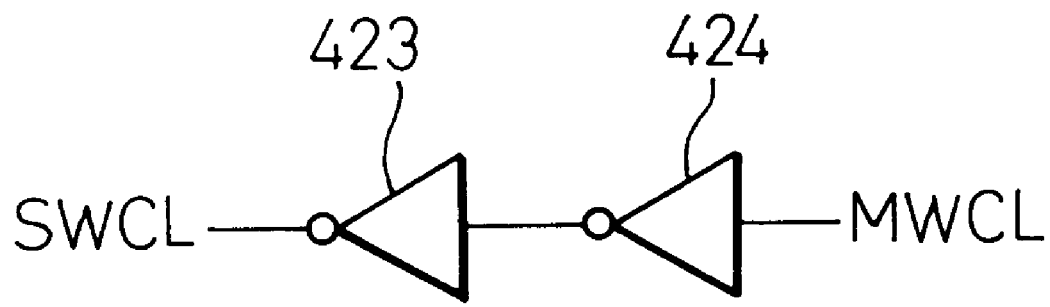
FIG. 26 shows a secondary write-only column selection driver of the memory of FIG. 25.

FIG. 26 shows an example of the SWCL driver 42 of FIG. 25.

The SWCL driver 42 is arranged at each of intersections of every second secondary word decoder column and sense amplifier rows as shown in FIG. 25. The SWCL driver 42 has two inverters 423 and 424. In this case, the MWCL driver 41 may have the same structure as that of FIG. 19.

The second aspect uses signals that control sense amplifiers, to control the WCL (MWCL, SWCL) lines. This realizes an efficient layout for the memory without increasing the number of signal lines in the memory.

As explained above, the second aspect of the present invention uses signals that control sense amplifiers, to control write-only column selection signals, to realize an efficient layout to control the write-only column selection lines without increasing the number of signal lines.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory comprising:
   a plurality of memory cells arranged in arrays;
   a plurality of direct-type sense amplifiers arranged in each column of the memory cells, for writing and reading data to and from a memory cell to be accessed;
   a plurality of column selection lines for selecting sense amplifiers that are in a column that involves the memory cell to be accessed;
   a plurality of write-only column selection lines for selecting sense amplifiers that are in a row that involves the memory cell to be accessed if the memory cell is accessed to write data thereto; and
   local drivers, wherein:
      the sense amplifiers are grouped, in each row, into sense amplifier blocks;
      the write-only column selection lines include first selection lines for selecting sense amplifier blocks that are in the row that involves the memory cell to be accessed for data write, and second selection lines for selecting sense amplifiers that are contained in the selected sense amplifier blocks; and
      the local drivers apply a selection signal to the second selection lines according to a selection signal from the first selection lines.

2. A semiconductor memory as claimed in claim 1, wherein a data write access is carried out to a memory cell that is related to an intersection of a specified one of the column selection lines and a specified one of the second selection lines.

3. A semiconductor memory as claimed in claim 1, further comprising:
   an input terminal for receiving mask data to mask some bits among data to be written into the semiconductor memory so that the masked bits are not written into the semiconductor memory; and
   first drivers for driving the first selection lines, the first drivers prohibiting, according to the mask data, at least part of the sense amplifier blocks that are in the row that involves the memory cell to be accessed, from being selected.

4. A semiconductor memory as claimed in claim 1, further comprising:
   an input terminal for receiving mask data to mask some bits among data to be written into the semiconductor memory so that the masked bits are not written into the semiconductor memory, wherein:
      the local drivers prohibit, according to the mask data, at least part of the sense amplifiers contained in the selected sense amplifier blocks from being selected without regard to the selection signal from the first selection lines.

5. A semiconductor memory as claimed in claim 1, employing a block selection signal for selecting a sense amplifier block that contains a sense amplifier that is in a column involving the memory cell to be accessed, wherein:
   the local drivers apply a selection signal to the second selection lines according to the block selection signal as well as the selection signal from the first selection lines.

6. A semiconductor memory comprising:
   a plurality of memory cells arranged in arrays;
   a plurality of direct-type sense amplifiers arranged in each column of the memory cells, for writing and reading data to and from a memory cell to be accessed;
   a plurality of column selection lines for selecting sense amplifiers that are in a column that involves the memory cell to be accessed;
   a plurality of write-only column selection lines for selecting sense amplifiers that are in a row that involves the memory cell to be accessed if the memory cell is accessed to write data thereto;
   an input terminal for receiving mask data to mask some bits among data to be written into the semiconductor memory so that the masked bits are not written into the semiconductor memory; and
   a plurality of drivers for driving the write-only column selection lines, the drivers prohibiting, according to the mask data, at least part of the sense amplifier blocks that are in the row that involves the memory cell to be accessed, from being selected.

7. A semiconductor memory as claimed in claim 6, wherein the sense amplifiers are grouped, in each row, into sense amplifier blocks; and the write-only column selection lines include first selection lines for selecting sense amplifier blocks that are in the row that involves the memory cell to be accessed for data write, and second selection lines for selecting sense amplifiers that are contained in the selected sense amplifier blocks.

8. A semiconductor memory as claimed in claim 7, wherein a data write access is carried out to a memory cell that is related to an intersection of a specified one of the column selection lines and a specified one of the second selection lines.

9. A semiconductor memory comprising:
   a plurality of memory cells arranged in arrays;
   a plurality of direct-type sense amplifiers arranged in each column of the memory cells, for writing and reading data to and from a memory cell to be accessed;
   a plurality of column selection lines for selecting sense amplifiers that are in a column that involves the memory cell to be accessed; and
   a plurality of write-only column selection lines for selecting sense amplifiers that are in a row that involves the memory cell to be accessed if the memory cell is accessed to write data thereto, wherein:
      the write-only column selection lines are controlled by a signal that controls the sense amplifiers and controlled by drivers that include main drivers and secondary drivers;

the main drivers select groups from among the sense amplifiers; and the secondary drivers drive sense amplifiers contained in the selected groups.

10. A semiconductor memory as claimed in claim 9, wherein the write-only column selection lines are controlled by a signal used to select the sense amplifiers.

11. A semiconductor memory as claimed in claim 10, wherein the sense amplifiers are shared sense amplifiers, and the write-only column selection lines are controlled by a bit line isolation gate control signal used to control the shared sense amplifiers.

12. A semiconductor memory as claimed in claim 10, wherein the write-only column selection lines are controlled by a bit line precharge activation control signal for the sense amplifiers.

13. A semiconductor memory as claimed in claim 10, wherein the write-only column selection lines are controlled by a latch enable signal for the sense amplifiers.

14. A semiconductor memory as claimed in claim 9, wherein the write-only column selection lines are orthogonal to the column selection lines.

15. A semiconductor memory as claimed in claim 9, wherein the main drivers are arranged at intersections of a column of main word decoders and rows of the sense amplifiers, and the secondary drivers are arranged at intersections of columns of secondary word decoders and rows of the sense amplifiers.

16. A semiconductor memory as claimed in claim 9, wherein the secondary drivers are arranged at intersections of every "N"th row of secondary word decoders and rows of the sense amplifiers, where "N" is a natural number.

17. A semiconductor memory as claimed in claim 9, wherein the secondary drivers are controlled by a block selection signal.

18. A semiconductor memory as claimed in claim 17, wherein lines for passing the block selection signal are arranged in columns of the secondary word decoders in parallel with the column selection lines.

19. A semiconductor memory as claimed in claim 18, wherein the column selection lines and the write-only column selection lines are formed in different metal wiring layers.

* * * * *